United States Patent [19]
Rostoker

[11] Patent Number: 5,744,856
[45] Date of Patent: Apr. 28, 1998

[54] NON-SQUARE DIE FOR INTEGRATED CIRCUITS AND SYSTEMS CONTAINING THE SAME

[75] Inventor: Michael D. Rostoker, Boulder Creek, Calif.

[73] Assignee: LSI Logic Corporation, Milpitas, Calif.

[21] Appl. No.: 476,431

[22] Filed: Jun. 7, 1995

Related U.S. Application Data

[60] Continuation-in-part of Ser. No. 270,123, Jul. 1, 1994, abandoned, which is a division of Ser. No. 933,430, Aug. 21, 1992, Pat. No. 5,329,157, which is a continuation-in-part of Ser. No. 916,328, Jul. 17, 1992, Pat. No. 5,340,772.

[51] Int. Cl.$^6$ .................. H01L 29/06; H01L 23/495; H01L 23/48
[52] U.S. Cl. .................. 257/618; 257/666; 257/786
[58] Field of Search .................. 257/618, 620, 257/666, 787, 777, 778, 669

[56] References Cited

U.S. PATENT DOCUMENTS

| | | |
|---|---|---|
| 4,253,280 | 3/1981 | Du Bois et al. .................. 257/620 |
| 4,498,096 | 2/1985 | Addie et al. .................. 257/772 |
| 5,329,157 | 7/1994 | Rosotker .................. 257/666 |

OTHER PUBLICATIONS

"VLSI Processor Architectures"; pp. 33–45; Philip C. Trevealen; Jun. 1982.

*Primary Examiner*—Jerome Jackson
*Assistant Examiner*—Jhihan B. Clark
*Attorney, Agent, or Firm*—Katz & Cotton, LLP

[57] ABSTRACT

Electronic systems using certain non-square dies, such as triangular dies, greatly elongated rectangular dies, parallelogram dies, trapezoidal, and the like, are able to be laid out in the area of a circular semiconductor wafer more "efficiently" than square dies. Further, a peripheral area of these certain non-square dies is advantageously increased relative to the area contained within the peripheral area, to accommodate increased I/O connections to the active elements of the die.

14 Claims, 18 Drawing Sheets

PRIOR ART

NON-SQUARE DIE FOR INTEGRATED CIRCUITS AND SYSTEMS CONTAINING THE SAME

CROSS REFERENCE TO RELATED APPLICATIONS

This patent application is a continuation-in-part of U.S. patent application Ser. No. 08/270,123, filed Jul. 1, 1994, now abandoned, which was a divisional of U.S. patent application Ser. No. 07/933,430, filed Aug. 21, 1992, now U.S. Pat. No. 5,329,157, issued Jul. 12, 1994, which was a continuation-in-part of U.S. patent application Ser. No. 07/916,328, filed Jul. 17, 1992, now U.S. Pat. No. 5,340,772, issued Aug. 23, 1994, all commonly owned by the Assignee of record.

TECHNICAL FIELD OF THE INVENTION

This invention relates to the fabrication of semiconductor devices on a wafer for use in an electronic system and, more particularly, to the shape and topology of individual dies described from the wafer.

BACKGROUND OF THE INVENTION

Modern integrated circuits are generally produced by creating several identical integrated circuit dies at individual "die sites" on a single semiconductor wafer, then scribing (slicing) the wafer to separate (singulate, dice) the dies from one another. Generally, the dies are either rectangular or square. On the other hand, semiconductor wafers are generally round. The prior art die sites are defined by a series of parallel scribe lines which extend chordwise across the wafer, perpendicular to another series of chordwise parallel scribe lines.

Circuits and active elements on the dies are created while the dies are still together (unsingulated) on the wafer by ion deposition, electron beam lithography, plasma etching, mechanical polishing, sputtering, and numerous other methods which are well known to those skilled in the art of semiconductor fabrication. These processes are highly developed and are capable of producing extremely complicated circuits on the dies at a relatively low cost. However, the prior art method of fabricating square or rectangular ("die sites") from a semiconductor wafer is impeding the development of complex integrated circuit dies. Problems with the prior art include (1) low wafer-layout-efficiency, $E_w$, and (2) low die-topology-efficiency, $E_D$.

According to the prior art fabrication of semiconductor devices on a wafer, a plurality of square or rectangular die sites are created on the face or a round semiconductor wafer. FIG. 1A is a diagram of the layout of prior art die sites on a semiconductor wafer. For simplicity of illustration, the wafer 104 in FIG. 1A is shown as being entirely round (circular in section). In practice, the wafer is usually provided with a "flat" extending chordwise from one circumferential point to another circumferential point located approximately ten degrees away from the one circumferential point. (This can be visualized by removing the five irregular die sites 120 located below (as viewed) the dashed line 122).

FIG. 1A, illustrating the prior art fabrication of semiconductor devices by scribing a semiconductor wafer to define square or rectangular die sites, shows a plurality (thirty seven shown) of square die sites 102a through 102kk which have been created on the face of a round semiconductor wafer 104. These die sites 102a . . . 102kk are termed "regular" die sites, since they will be used for integrated circuitry. A first series of scribe lines 106 and a second series of scribe lines 108 intersecting the first series of scribe lines 106, at an angle equal to ninety degrees, on the surface of the wafer 104, delineate one die from another, and ultimately determine the size and shape of the individual dies 102a . . . 102kk. Typically, all of the dies are fabricated in an identical manner to contain identical semiconductor circuits. Typically, the individual dies (chips) are connected to lead frames, or the like, and are packaged in some manner to interfere with external (to the chip) systems or components.

It can be easily seen from the prior art that "regular" square dies 102 (102a . . . 102kk) are not geometrically obtainable around the periphery of the round wafer 104. (By way of analogy—square pegs simply do not fit neatly into round holes.) To the contrary, substantially entirely around the periphery of the water there are a number of "irregular" die sites 120, of various shapes and sizes, shown with dots ("•") to distinguish the "irregular" die sites 120 from the "regular" die sites 102. These die sites 120 are irregular in that they typically are not used for the fabrication of integrated circuitry. Rather, the peripheral area of the wafer occupied by the irregular die sites 120 is simply discarded after the regular die sites 102 are singulated. The peripheral area of the wafer occupied by the aggregate of the irregular die sites 120 is referred to herein as "wasted real estate".

By way of illustrating the problems in the prior art, a wafer is usually on the order of 3–8, or more, inches in diameter, and the dies are usually square, having a side dimension on the order of one-eighth to one-half inch, or larger. The total wafer area is on the order of 14.5 square inches (for a four and three tenths inch wafer), and the area in which "regular" dies can be obtained is on the order of 9.25 square inches (37 square shaped dies, each die having equal one quarter inch$^2$). This can be expressed as a wafer-layout-efficiency "$E_w$" on the order of 0.64 (regular die site area divided by wafer area). Evidently, in light of the non-trivial cost, time and effort that goes into making wafers, it would be desirable to increase this efficiency towards ONE. Hence, it can be seen that laying out (scribing) square dies on a round wafer will create a lot of wasted real estate.

Turning our attention from the shape of prior art square dies, to the topology of these individual dies, we see other problems.

Generally, as far as the present invention is concerned, there are two topological areas of interest on a given die:

1. An "active element area" containing active circuit elements, such as logic gates, interconnections between same, etc.; and 3. An "I/O area" containing Input/Output (I/O) "bond pads", or the like, to which external connections will be made to the die, such as by wire bonding or by tape-automated bonding (TAB).

These two topological areas, in aggregate, account for the "total area" of the die, and generally, the I/O area surrounds the active element area.

The demands placed on modern integrated circuits are similarly headed in two directions:

1. Fitting (fabricating) as many active elements as possible in the active element area, to create more complex devices; and 2. Fitting as many bond pads as possible in the I/O area, to accommodate increase numbers of connections to the device.

These demands compete against each other, in the sense that more I/O area means less active area, for a given die the size (e.g., total area), and vice-versa, The active element area is typically located in a central portion of the die, with the I/O area surrounding the active element area. This appears to be "standard" methodology as driven by "standard" design rules.

A useful indicator of the size of active circuit elements is "line width", which is essentially the size of the smallest conductive line that can be created on the die. Through advances in semiconductor fabrication technology, line widths in the sub-micron (<1.0 μm) range are already being achieved.

On the other hand, the size of bond pads is remaining relatively fixed and, more profoundly, relatively large vis-a-vis line widths. Bond pads are on the order of thousands of an inch. Thus, it is evident that bond pas developments are lagging the rapid development and increased utilities of the active element area, and result in an unfavorable I/O bond pad area: active element area ratio.

FIG. 1B shows an individual prior art square die 150, such as a die 102 (FIG. 1A), having four side edges 152, 154, 156 and 158. The die 150 has a total area (the length of a side squared), equalling the sum of a central active element area 160 and an I/O area 162 surrounding the active element and extending to the four side edges of the die. The I/O area 162 is shown as the area outside of the dashed line 164. A plurality of bond pads 166 (only five of many shown) are disposed about the periphery of the die 150 in the I/O area 162. The active element area 160 contains circuit elements. A circuit element 168, illustrative of many circuit elements, is shown interconnected by lines 170 to the bond pads 166.

By way of a practical illustration of bonding wires to a die bond pad in the I/O area, the size of a die bond pad 166 is on the order of 0.004 inches (100 μm), per side (bond pads are typically square), and the pads are spaced apart from one another on the order of 0.002 inches (50 μm). For tape-automated bonding (TAB), the die bond pads are on the order of 0.002 inches (50 μm), per side, and are spaced 0.002 inches (50 μm). Also, a square die site typically has sides that are one half inches, total periphery of two inches, and a total area of one quarter inch$^2$.

The I/O area 162 typically measures 0.010 inches wide, to allow for formation of the bond pads 166, and extends around the periphery of the die. Hence, for a square die having sides measuring one half inch, the active element area 160 will measure 0.480 inches by 0.480 inches.

Therefore, the geometric configuration of the prior art square die, having sides measuring one half inch, will result in approximately three hundred twenty nine bond pads (for external I/O connections to the die). This is not an uncommonly high number of I/O connections for a modem, complex semiconductor device. However, advances in complexity of integrated circuits has resulted in a great demand for increasing the number of bond pads in the I/O area.

Furthermore, the rate of I/O area (162) to active element area (160) for the square die 150 is 0.085 (dimensionless). In other words, the amount of I/O area vis-a-vis the overall area can be expressed as a die-topology-efficiency "$E_D$", and is 0.085 for this example of a prior art square die.

By way of summary, the prior art square die 150 of FIG. 1B (102, FIG. 1A):

(a) the "total area" is 0.2500 inch$^2$;

(b) the "active element area" is 0.2304 inch$^2$;

(c) the "I/O area" is 0.0196 inch$^2$;

(d) the total periphery is 2.000 inches;

(e) number of bond pads is 329;

(f) die-topology-efficiency, $E_D$ is 0.085.

Because of the enormous disparity between die bond pad size and line width, and the increasing demand for I/O, the demand for I/O area is, in a sense, beginning to outpace the demand for active area and adversely offset the available active element area on a given die.

We see then, in general, that prior art square dies are not "efficient", in the sense that:

1. the geometric configuration of square dies result in low wafer-layout-efficiency "$E_w$", thus creating "wasted real estate";

2. square dies have a very low die-topology-efficiency "$E_D$", limiting the number of bond pads that can be fabricated on the periphery of a die.

DISCLOSURE OF THE INVENTION

It is therefore an object of the present invention to provide a technique for increasing the number of individual dies of a given area that can be laid out on a single semiconductor wafer, thereby reducing wasted real estate on a wafer, in other words increasing the wafer-layout-efficiency $E_w$.

It is another object of the present invention to provide a technique for increasing the available I/O area on a die, vis-a-vis the active element area (or vis-a-vis the total die area), in other words increasing the die-topology-efficiency $E_D$.

It is another object of the present invention to provide a technique for singulating non-scribable dies from a semiconductor wafer.

It is another object of the present invention to provide a technique for fabricating dissimilar dies on a semiconductor wafer.

According to the invention, triangular die sites are formed on a semiconductor wafer providing increased utilization of the semiconductor wafer, hence, increasing the water-layout-efficiency and reducing wasted wafer real estate.

According to an aspect of the invention, triangular dies are singulated from the wafer and provide increased I/O area to active element area ratio, hence, increasing the die-topology-efficiency and, allowing for an increased number of bond pads in the I/O bond pad area.

According to another aspect of the invention, other (than triangular) certain non-square die sites are formed on a semiconductor wafer providing increased utilization of the semiconductor, hence, increasing the wafer-layout-efficiency and reducing wasted wafer real estate.

According to another aspect of he invention, such certain non-square dies are singulated from the wafer and provide for increased I/O area to active element area ratio, hence, increasing the die-topology-efficiency and, allowing for an increased number of bond pads in the I/O bond pad area.

According to another aspect of the invention, dissimilar (non-homogeneous or nonuniformly-oriented) dies are formed on a semiconductor wafer.

According to another aspect of the invention, nonscribable dies are formed on a semiconductor wafer, wherein rows of dies are separated from the wafer, the rows are further scribed, and the dies are singulated from the rows.

According to another aspect of the invention, dissimilar dies are formed on a wafer using a composite mask having at least two dissimilar patterns.

According to another aspect of the invention, nonuniformly-oriented dies are formed on a wafer using a mask in at least two different orientations.

It is contemplated that the method and apparatus of the present invention may be utilized in system level products comprising single chip modules (SCM) often including other electrical components (such as capacitors, resistors, inductors, etc.); multi-chip modules (MCM) having at least two integrated circuit die in the same or separate packages, with or without other electrical components; board level products (BLP) such as those having multiple integrated circuits on printed wiring board(s) (PWB); and box level products (Boxes) which may include a combination of elements from the list of SCM, MCM, BLP and the like. One or more of such SCM, MCM, PWB or BLP's may act as, or be integrated into a functional system or subsystem. The system level products contemplated include digital data storage; security and surveillance systems, general purpose computers (such as personal computers, work stations, servers, mini computers, mainframe computers and super computers); digital audio and video compression and transmission; transportation vehicles (such as airplanes, trains, automobiles, helicopters, rockets, missiles, boats, submarines, and the like); subsystems utilized in such vehicles (such as navigational positioning, i.e., Global Positioning System (GPS), navigational displays and controllers, hazard avoidance such as radar and sonar, fly by wire control, and digital engine control and monitoring); entertainment systems (such as digital television and radio, digital cameras, audio and video recorders, compact disc players, digital tape, or the like); and communications (such as PBX, telephone switching, voice mail, auto attendant, network controllers, video teleconferencing, digital data transmission (such as token ring, ethernet, ATM, or the like), and subsystems or subassemblies for inclusion or attachment to more complex system level products.

Other objects, features and advantages of the invention will become apparent in light of the following description thereof.

DETAILED DESCRIPTION OF THE INVENTION

For the purpose of understanding the terminology employed in this application, the following terms are used:

Scribing refers to the process of creating a series of lines on a semiconductor wafer to form a desired individual die shape or row.

Scribable die sites means individual dies having a shape (geometric configuration) permitting the process of scribing the die sites while on a semiconductor wafer.

Non-scribable die sites means individual dies whose shape does not permit them to be scribed while on a semiconductor wafer. However, they may be partially scribed while on the wafer.

Separating refers to removing a portion of all the dies on a wafer from the wafer, such as the die in a particular row, whether the die sites are fully scribed or not.

Singulate, or "dice", refers to the process of disassociating one from a neighboring die.

Dissimilar dies are dies that either: 1) are "nonuniformly-oriented" in that they are oriented differently than other dies on the wafer, or 2) are "non-homogeneous" in that they are shaped differently and contain different circuitry than other dies on the wafer, or 3) both.

Figure 1A:
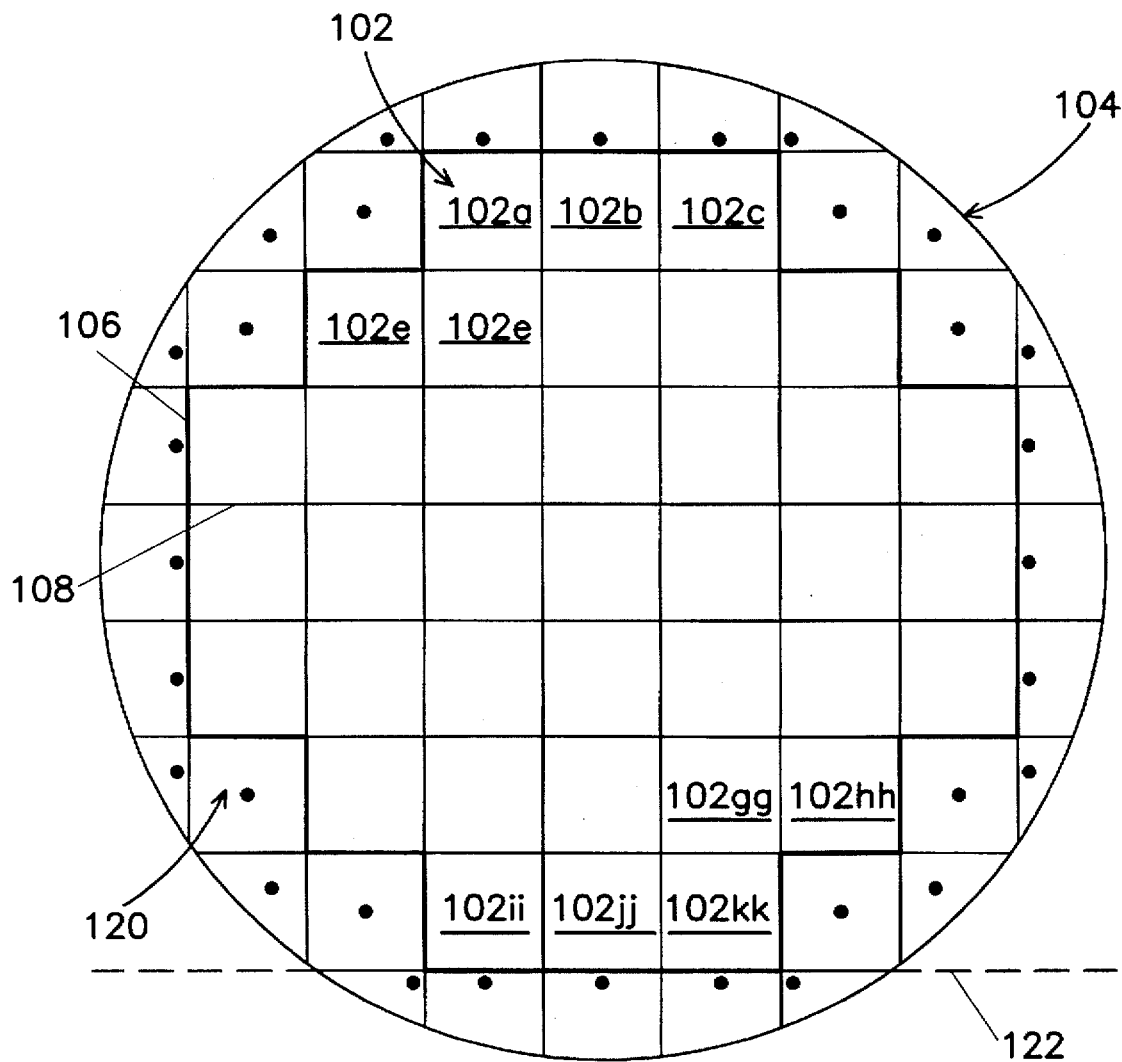
FIG. 1A is a diagrammatic representation of a prior art semiconductor wafer, scribed to form square die sites.
Figure 1B:
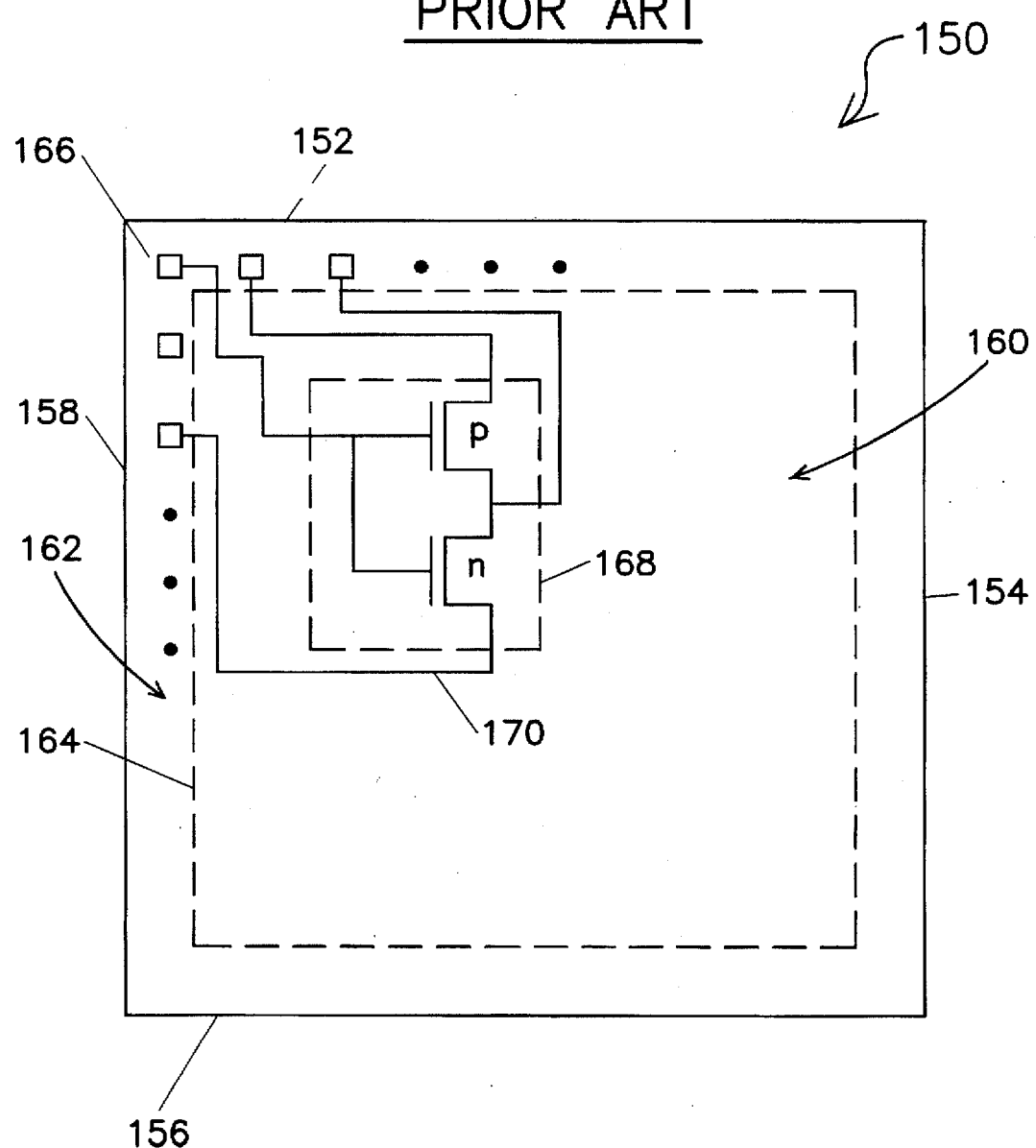
FIG. 1B is a diagrammatic representation of a prior art square die, singulated from the wafer of FIGS. 1A.

FIGS. 1A and 1B show prior art square dies laid out on a wafer, and the topology of individual square dies, respectively, and has been discussed above. By way of review, it was determined that a square die has a waferlayout-efficiency $E_w$ on the order of 0.64 and has a die-topology-efficiency $E_D$ of 0.085. According to the present invention, it would be desirable to increase one, or both, of these factors.

EQUILATERAL TRIANGLE DIES SCRIBED IN A SEMICONDUCTOR WAFER

Figure 2A:
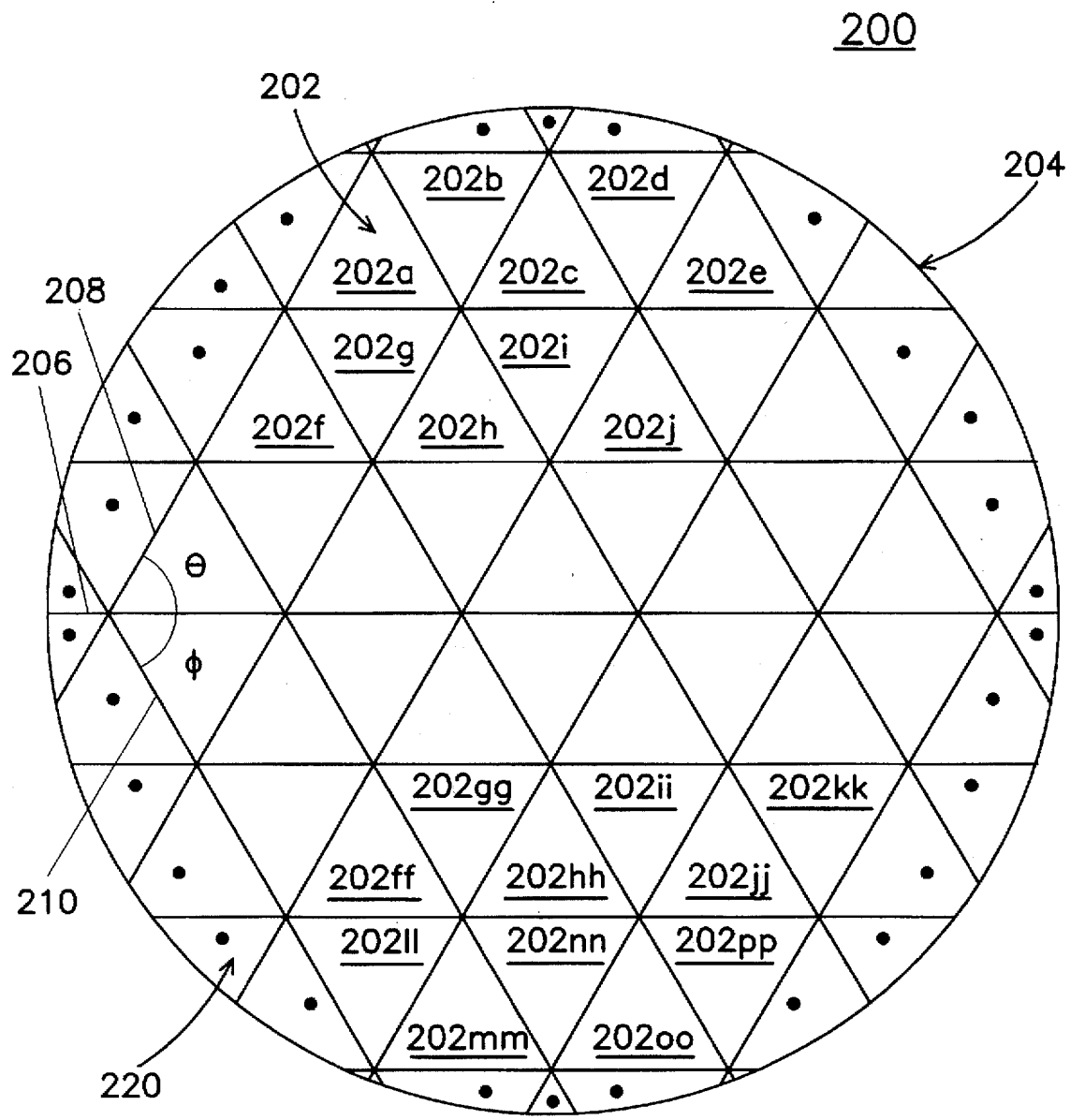
FIG. 2A is diagrammatic representation of a semiconductor wafer, scribed to form a plurality of equilateral triangular die sites, according to the present invention.
Figure 2B:
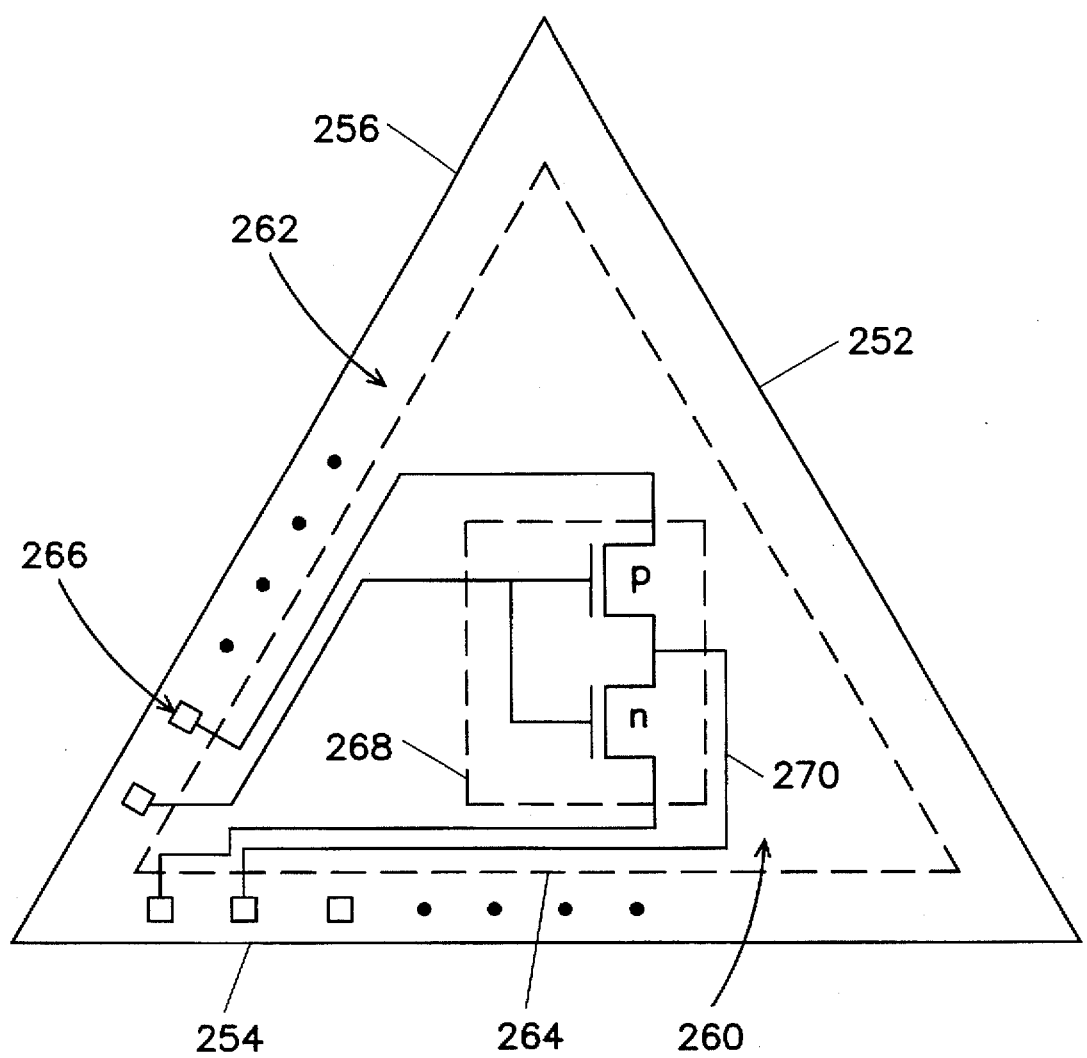
FIG. 2B is a diagrammatic representation of a single equilateral triangular die, singulated from the wafer of FIG. 2A.

FIGS. 2A and 2B show one embodiment of the invention, wherein dies are formed as equilateral triangles. According to the invention, the geometric configuration of this embodiment will increase both the wafer-layout-efficiency and the die-topology-efficiency.

Wafer-Layout-Efficiency, $E_w$

FIG. 2A shows a technique 200, according to the present invention, for laying out equilateral triangular shaped dies 202 on a semiconductor wafer 204. As in FIG. 1A, a number (forty two shown) of die sites 202, namely 202a ... 202pp, are "regular" in the sense that they are all intended to be (or capable of being) processed into working integrated circuit devices, and a number of die sites 220 (marked with a dot) are "irregular" in the sense that they are not intended to be processed into working integrated circuit devices. In marked contrast, however, to the layout of FIG. 1A, the layout of FIG. 2A provides for an increased number of "regular" die sites per wafer, with reduced wasted wafer real estate (irregular die sites).

In order to create the equilateral triangle die sites 202a ... 202pp on a semiconductor wafer, the wafer is scribed in three directions, rather than in two directions (FIG. 1A). More particularly, the following method is used for forming equilateral triangular dies 202 on a semiconductor wafer 204:

(a) providing a first series of parallel, substantially equally spaced-apart parallel scribe lines 206 chordwise across the semiconductor wafer 204;

(b) providing a second series of substantially equally spaced-apart parallel scribe lines 208 chordwise across the semiconductor wafer 204 intersecting (at points) the first series of parallel scribe lines 206 at a first angle "Θ" equal to "positive" sixty degrees;

(c) providing a third series of substantially equally spaced-apart parallel scribe lines 210 chordwise across the semiconductor wafer 204 intersecting the first series of parallel scribe lines 206 at a second angle "φ" equal to "negative" sixty degrees and intersect the points at which the second series of parallel scribe lines intersect the first series of parallel scribe lines.

The term "substantially equally spaced-apart" means that a given scribe line in a series of parallel scribe lines is substantially (+/−10%) equidistant from a neighboring scribe line in the series.

With respect to this, and other embodiments of the invention, the angle "Θ" is generally a "positive", diagonal angle between zero and ninety degrees. The angle "φ" is generally a "negative" diagonal angle, in other words, and angle between ninety and one hundred eighty degrees.

The plurality of areas enclosed by the first scribe lines 206, the second scribe lines 208 and the third scribe lines 210 define a respective plurality of die sites 202 (202a ... 202pp) having equilateral triangular geometric configurations (60°-60°-60° angles). Also, it can be seen from FIG. 2A that the plurality of equilateral triangular die sites 202, in aggregate, form a hexagon (shown as a darkened line) that fits more efficiently into the round area of the wafer 204 (as compared with the fit of the square die sites of FIG. 1A).

By way of the practical illustration, consider the case of a four and three tenths (4.3) inch semiconductor wafer 204 with equilateral triangular die sites 202, each die site having an area of one half inch$^2$, (namely comparing favorable with the area of the prior art square dies 102, FIG. 1A). We see that:

1. each die will have three sides (bases) measuring 0.7598 inches;
2. 42 regular die sites 202a ... 202pp occupy an area of 10.5 inch$^2$;
3. the wafer area is approximately 14.5 inch$^2$.

This yields a wafer-layout-efficiency $E_w$ on the order of 0.72, for equilateral triangular die sites (FIG. 2A), as contrasted with 0.63 for square die sites (See FIG. 1A). In other words, the wafer-layer-efficiency of equilateral triangular die sites is on the order of 14% higher than for square dies. Therefore, the present invention will provide a 14% increase in the number of semiconductor device that can be laid out on a wafer.

Die-Topology Efficiency

FIG. 2B shows an individual equilateral triangular die 250, such as a die 202 (FIG. 2A), having thee side edges 252, 254, and 256. The die 250 has a total area (one half base multiplied by height) equally the sum of a central active element area 260 and an I/O area 262 surround the active element area 260 and extending to the three side edges of the die. The I/O area 262 is shown as the area outside of the dashed line 264. A plurality of bond pads 266 (only five shown) are disposed about the periphery of the die 250 in the I/O area 262. The active element area 260 contains circuit elements. A circuit element 268, illustrative of many circuits elements, is shown interconnected by lines 270 to the bond pads 266.

Evidently, the number of I/O pads that can be accommodated about the periphery of a die is closely related to the perimeter of the die. Therefore, if we desire to increase available I/O area for a die of given area, we must increase the perimeter of the die while maintaining the total area of the die constant.

According to the present invention, certain non-square dies, including triangular dies, have more favorable ratios of perimeter:area, hence, allowing for increased number of I/O bond pads in periphery of a die.

Theoretical Die-Topology-Efficiency (Perimeter:Area)

By way of a theoretical application to illustrate the present invention, consider the case of a prior art square die having an area of one "unit$^2$". Each side of the square die site will measure one "unit". For a square die having four sides, each measuring one unit, the perimeter is four units and the area is one unit$^2$. The ratio of perimeter to area is 4:1.

For an equilateral triangular die having an area of one unit$^2$, the side dimensions will be 1.520 units each and the perimeter will be 4.560 units. Therefore, the ratio of perimeter to area is 4.560:1, or approximately 14% more perimeter than that of the prior art square die having the same area. Thus, according to the present invention, equilateral triangular dies provide increased periphery per area for increasing the number of bond pads that can be disposed in the I/O case.

Practical Die-Topology-Efficiency (I/O Area:Active Element Area)

Referring back to FIG. 2B for a practical illustration of determining the die-topology-efficiency $E_D$, the size of the die bond pads 266 is on the order of 0.004 inches (100 µm), per side (bond pads are typically square), and the pads are spaced apart from one another on the order of 0.002 inches (50 µm). The I/O area 262 typically measures 0.010 inches wide, to allow for formation of the bond pads 266, and extends around the periphery of the die.

The total area of the equilateral die will remain at one half inch² (same area as the prior art square die). Also, each side of the equilateral triangle will measure approximately 0.7598 inches, yielding a perimeter of 2.2794 inches. Thus, according to the present invention, the equilateral triangular die will yield 377 bond pads, an increase of approximately 14% over the 329 bond pads of the prior art square die.

The active element area 260 of the die 250 is 0.2277 inch², which compares favorably with the active element area (0.2304 inch²) of the square die 150 (FIG. 1A).

The I/O area of the equilateral triangular die will be 0.0223 inch², an increase of 14% over the I/O area (0.0196 inch²) of a square die (150). Moreover, the die-topology-efficiency ($E_D$) of the equilateral triangle die 250 is 0.098, as compared with that (0.085) of a square die (150). Therefore, according to the present invention, an equilateral triangular die will have a die-topology-efficiency 15% greater than the prior art square die, therefore meeting the industry need of increased number of bond pads.

By way of summary, for the equilateral triangular die 250 (202, FIG. 2A):

(a) the :total area" is 0.2500 inch²;

(b) the "active element area" is 0.2277 inch²;

(c) the "I/O area" is 0.0223 inch²;

(d) the total periphery is 2.2794 inches, a 14% increase;

(e) number of bond pads is 377, a 14% increase;

(f) die-topology-efficiency, $E_D$ is 0.098, a 15% increase.

Generally, we observe the geometric shapes which are thought to be inefficient "enclosers" of area (i.e., having a high ratio of perimeter:area), turn out to be unexpectedly efficient from the viewpoint of providing increased I/O area around the periphery of a die, vis-a-vis the contained active element area.

Thus, we see that equilateral triangular dies provide both an increase in wafer-layout-efficiency $E_w$, and an increase in die-topology-efficiency $E_D$, vis-a-vis square does, hence, providing for (1) more die sites per semiconductor wafer and (2) an increase in the number of bonding pads that can be obtained in the I/O area.

RIGHT ISOSCELES TRIANGLE DIES SCRIBED IN A SEMICONDUCTOR WAFER

Figure 3A:
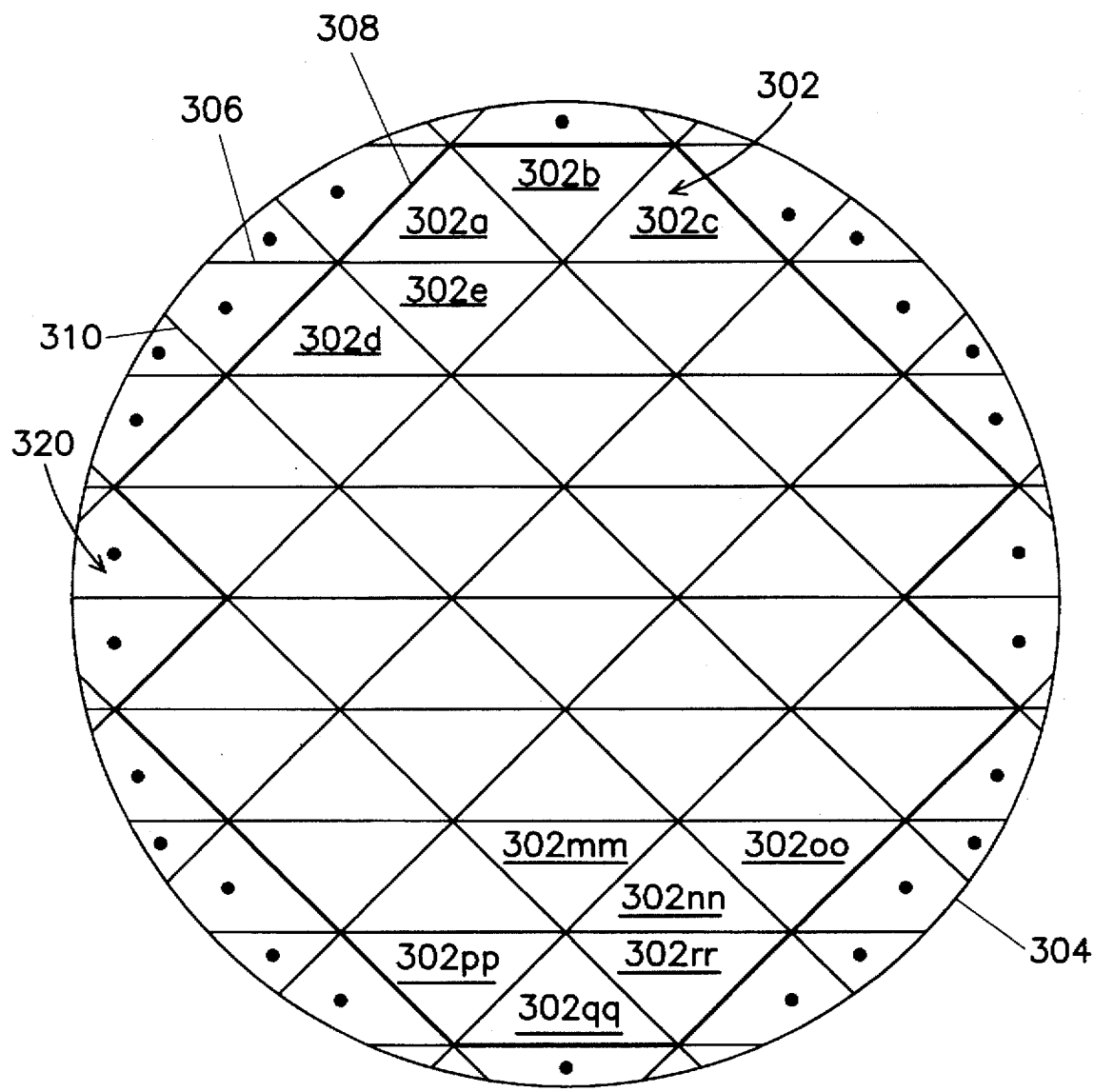
FIG. 3A is a diagrammatic representation of a semiconductor wafer, scribed to form a plurality of right isosceles triangular die sites, according to another embodiment of the present invention.
Figure 3B:
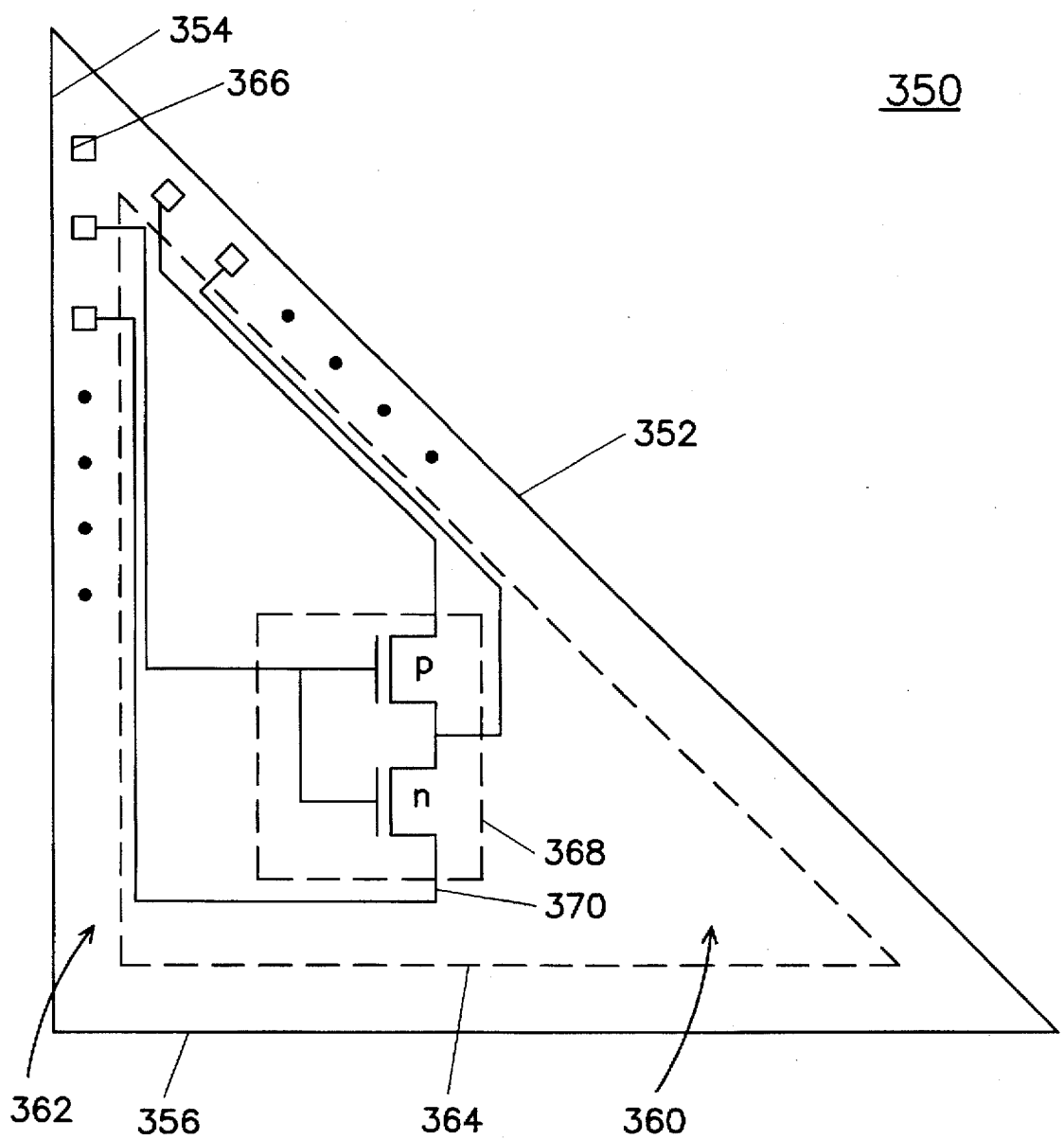
FIG. 3B is a diagrammatic representation of a single right isosceles triangular die, singulated from the wafer of FIG. 3A.

FIGS. 3A and 3B show an alternate embodiment of the invention, wherein the dies are formed as right isosceles triangles. The geometric configuration of this embodiment will increase the wafer lay-out efficiency and the die-topology-efficiency.

Wafer-Layout-Efficiency, $E_w$

FIG. 3A shows a technique 300, according to the present invention, for laying out right isosceles triangular shaped dies 302 on a semiconductor wafer 304. As in the prior art square dies, FIG. 1A, a number (forty four shown) of die site 302 are "regular" in the sense that they are intended to be processed into working integrated circuit devices, and a number of die sites 320 are "irregular" in the sense that they are not intended to be processed into working integrated circuit devices. Also, in marked contrast to the prior art layout of square dies, the layout of the present invention in FIG. 3A provides for an increased number of "regular" dies per wafer, with reduced wasted real estate.

In order to create the right isosceles triangular die sites 302a . . . 300rr on a semiconductor wafer, the wafer is scribed in three directions, rather than in two directions (FIG. 1A). More particularly, the following method is used for forming right isosceles triangular dies 302 on a semiconductor wafer 304:

(a) providing a first series of parallel, substantially equally spaced-apart parallel scribe lines 306 chordwise across the semiconductor wafer 304;

(b) providing a second series of substantially equally spaced-apart parallel scribe lines 308 chordwise across the semiconductor wafer 304 intersecting (at points) the first series of parallel scribe lines 306 at a first angle "Θ" equal to "positive" forty-five degrees;

(c) providing a third series of substantially equally spaced-apart parallel scribe lines 310 chordwise across the semiconductor wafer 304 intersecting the first series of parallel scribe lines 306 at a second angle "φ" equal to "negative" forty five degrees and intersect the points at which the second series of scribe lines intersect the first series of scribe lines.

The plurality of area enclosed by the first scribe lines 306, the second scribe lines 308 and the third scribe lines 310 define a respective plurality of die sites 302 (302a . . . 302rr) having right isosceles triangular geometric configurations (45°-45°-90°). Also, it can be seen from FIG. 3A that the plurality of right isosceles triangle die sites 302, in aggregate, fit more efficiently into the round wafer 304 (as compared with fit of the prior art square die sites in FIG. 1A).

By way of a practical illustration, consider the case of a four and three tenths (4.3) inch semiconductor wafer with right isosceles triangular die sites 302, each die site having an area of one half inch², (namely comparing favorably with the area of the prior art square dies 102, FIG. 1A). We see that:

1 each die will have three sides measuring √2/2, √2/2, and one inch, respectively.

2. 44 regular die sites 302a . . . 302rr occupy an area of 11 inch²;

3. the wafer area is approximately 24.5 inch².

This yields a wafer-layout-efficiency $E_w$ on the order of 0.76, for right isosceles triangular shaped die sites (FIG. 3A), as contrasted with 0.63 square die sites (See FIG. 1A). In other words, the wafer-layer-efficiency of right isosceles triangular die sites is on the order of 20% higher than for square dies. Therefore the present invention will provide a 20% increase in the number of semiconductor devices that can be laid out on a wafer.

Die-Topology-Efficiency

FIG. 3B shows an individual right isosceles triangular die 350, such as a die 302 (FIG. 3A), having three side edges 352, 354, and 356. The die 350 has a total area equalling the sum of a central active element area 360 and an I/O area 362 surrounding the active element area 360 and extending to the three side edges of the die. The I/O area 362 is shown as the area outside of the dashed line 364. A plurality of bond pads 366 (only five shown) are disposed about the periphery of the die 350 in the I/O area 362. The active element area 360 contains circuit elements. A circuit element 368, illustrative of any circuit elements, is shown interconnected by lines 370 to the bond pads 366.

Theoretical Die-Topology-Efficiency (Perimeter Area)

By way of a theoretical application to illustrate the present invention, consider the case of a prior art square die having an area of one "unit$^2$. For a square die having four sides, each measuring one unit, the perimeter is four units, and the ratio of perimeter to area is 4:1.

For a right isosceles triangular die having an area of one unit$^2$, the three side dimensions will measure $\sqrt{2},\sqrt{2}$, and two units, and the perimeter will measure 4.828 units. Therefore, the ratio of perimeter to area is 4.828:1, or approximately 20% more perimeter than that of the prior art square die having the same area. Thus, according to the present invention, right isosceles triangular dies provide increased periphery area for increasing the number of bond pads that can be disposed in the I/O area.

Practical Die-Topology-Efficiency (I/O Area:Active Element Area)

Referring back to FIG. 3B for a practical illustration of determining the die-topology-efficiency $E_D$, the size of the die bond pads 366 is on the order of 0.004 inches (100 µm), per side, and the pads are spaced apart from one another on the order of 0.002 inches (50 µm). The I/O area 362 typically measures 0.010 inches wide, to allow for information of the bond pads 366, and extends around the periphery of the die.

The total area of the right isosceles triangular die will remain at one half inch$^2$ (same area as the prior art square die). Also, the right isosceles triangular die will have a perimeter of 2.4140 inches. Thus, according to the present invention, the right isosceles triangular die will yield 339 bond pads, an increase of approximately 21% over the bond pads of the prior art square die.

The active element area 360 of the die 350 is 0.2264 inch$^2$, which compares favorably with the active element area (0.2304 inch$^2$) of the square die 150 (FIG. 1A).

The I/O area of the equilateral triangular die will be 0.0236 inch$^2$, an increase of 20% over the I/O area (0.0196 inch$^2$) of a square die (150). Moreover, the die-topology-efficiency ($E_D$) of the right isosceles triangular die 350 is 0.104, as compared with that (0.085) of a square die (150). Therefore, according to the present invention, a right isosceles triangular die will have a die-topology-efficiency 22% greater than the prior art square die, therefore meeting the industry need of increased number of bond pads.

By way of summary, for the right isosceles triangular die 350 (302, FIG. 3A):

(a) the "total area" is 0.2500 inch$^2$;
(b) the "active element area" is 0.2264 inch$^2$;
(c) the "I/O area" is 0.0236 inch$^2$;
(d) the total periphery is 2.4141 inches, a 20% increase;
(e) number of bond pads is 399, a 21% increase;
(f) die-topology-efficiency, $E_D$ is 0.104, a 22% increase.

Therefore, according to the invention, right isosceles triangular dies produces an increase in both wafer and layout-efficiency $E_w$, and in die-topology efficiency $E_D$.

30-60-90 RIGHT TRIANGULAR DIE SCRIBED IN A SEMICONDUCTOR WAFER

Figure 4A:
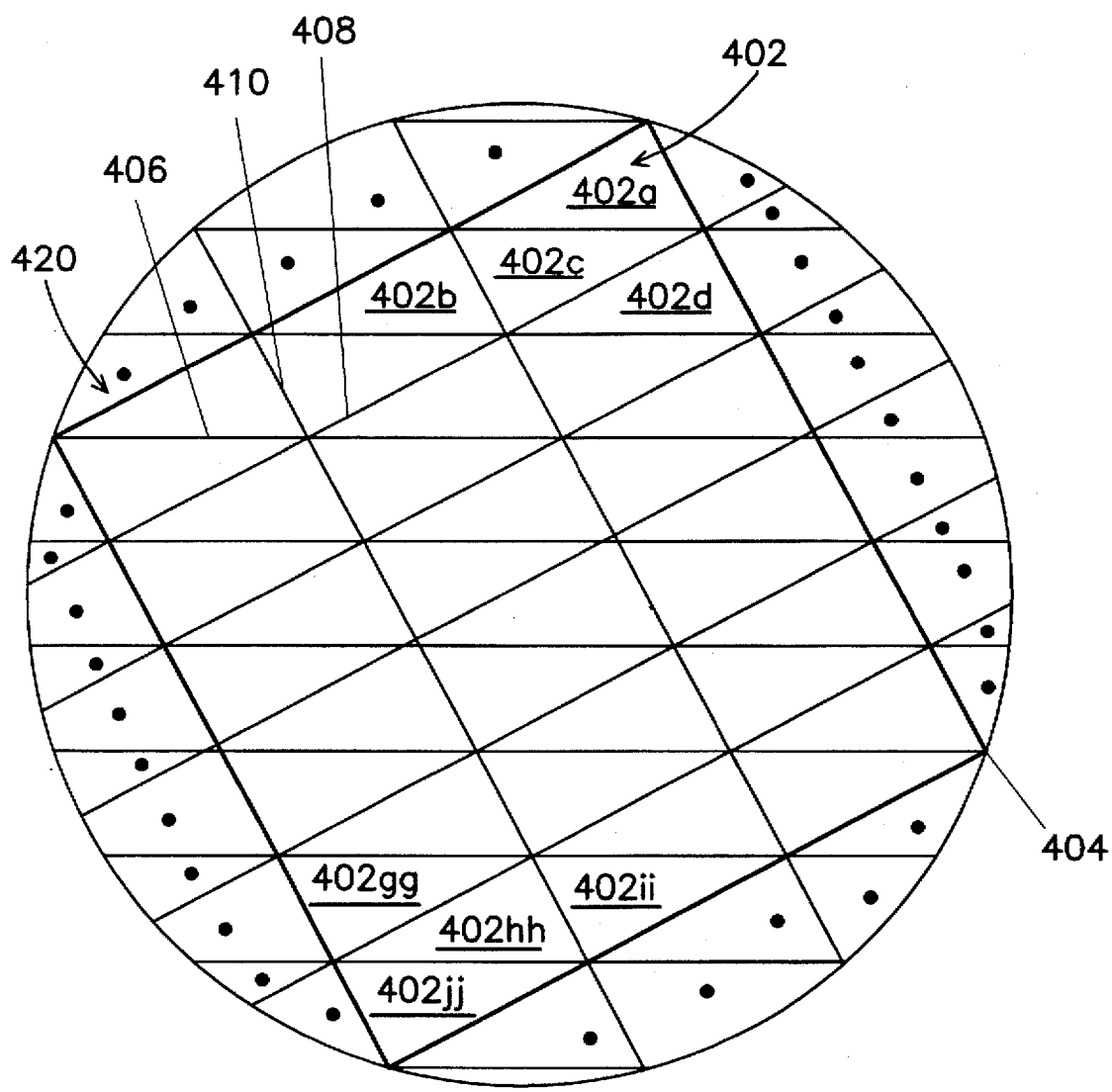
FIG. 4A is a diagrammatic representation of a semiconductor wafer, scribed to form 30-60-90 right triangular die sites, according to another embodiment of the present invention.
Figure 4B:
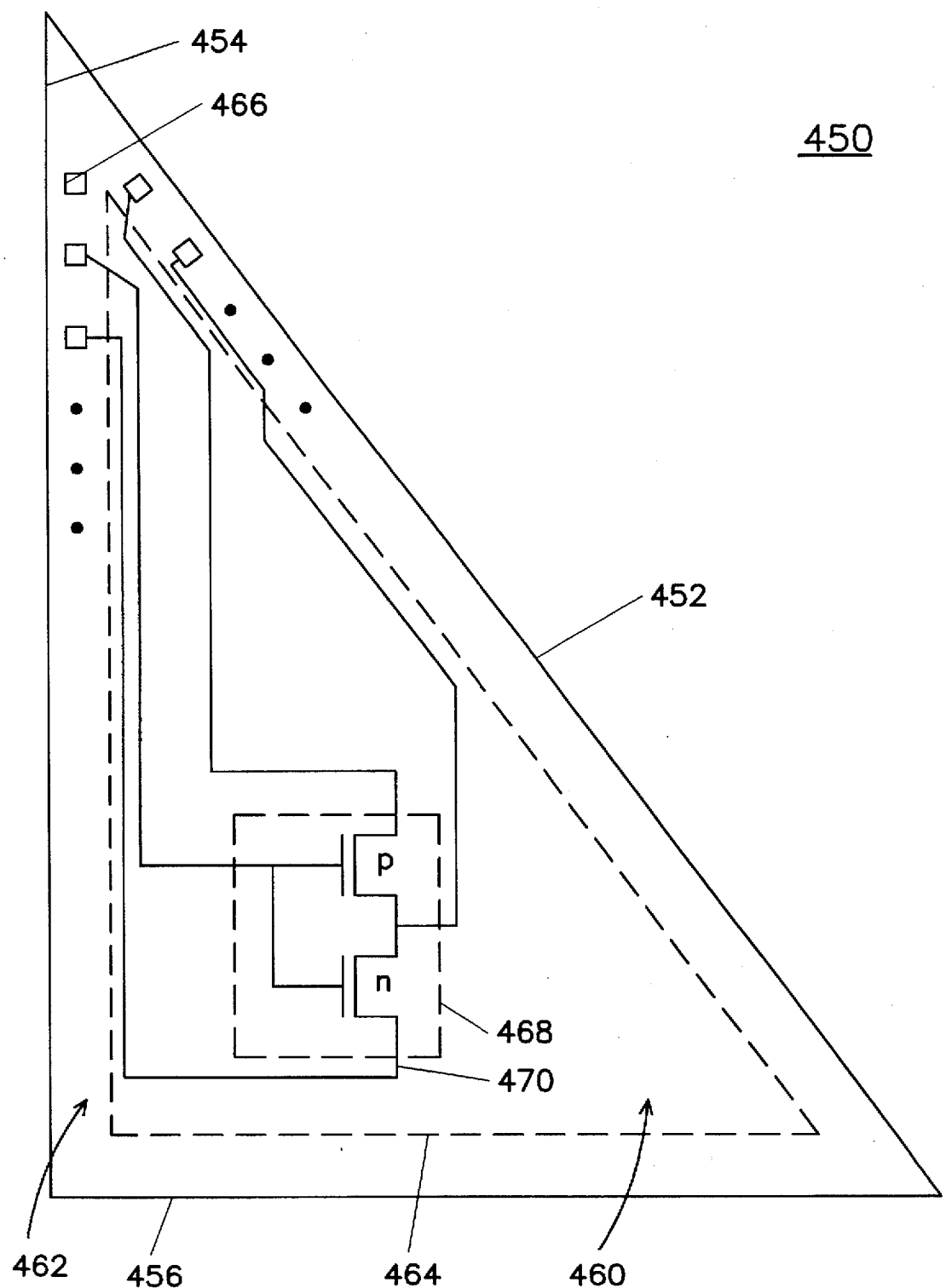
FIG. 4B diagrammatic representation of a single 30-60-90 right triangular die, singulated from the wafer of FIG. 4A.

FIGS. 4A and 4B show an alternate embodiment of the invention, wherein the dies are formed as 30°-60°-90° triangles. Although the geometric configuration of this embodiment will provide a slight decrease (1%) in wafer-layout-efficiency, the die-topology-efficiency will increase (28%), thus providing increased number of bond pads in the I/O bond pad area.

Wafer-Layout-Efficiency, $E_w$

FIG. 4A shows a technique 400, according to the present invention, for laying out 30°-60°-90° triangular shaped dies 402 on a semiconductor wafer 404. As in FIG. 1A, a number (thirty six shown) of die sites 402, namely 402a ... 402jj, are "regular" in the sense that they are all intended to be (or capable of being) processed into working integrated circuit devices, and a number of die sites 420 (marked with a dot) are "irregular" in the sense that they are not intended to be processed into working integrated circuit devices. The layout of FIG. 4A provides for substantially the same number of "regular" die sites per wafer (i.e., 36) when compared with prior art square dies.

In order to create the 30°-60°-90° triangular die sites 402a ... 402jj on a semiconductor wafer, the wafer 404 is scribed in three directions, rather than in two directions (FIG. 1A). More particularly, the following method is used for forming 30°-60°-90° triangular die 402 on a semiconductor wafer 404:

(a) providing a first series of parallel, substantially equally spaced-apart parallel scribe lines 406 chordwise across the semiconductor wafer 404;

(b) providing a second series of substantially equally space-apart parallel scribe lines 408 chordwise across the semiconductor wafer 404 intersecting (at points) the first series of parallel scribe lines 406 at a first angle "Θ" equal to "positive" thirty degrees; and (c) providing a third series of substantially equally spaced-apart parallel scribe lines 410 chordwise across the semiconductor wafer 404 intersecting the first series of parallel scribe lines 406 at a second angle "φ" equal to "negative" sixty degrees and intersect the points at which the second series of parallel scribe lines intersect the first series of parallel scribe lines.

The plurality of areas enclosed by the first scribe lines 406, the second scribe lines 408 and the third scribe lines 410 define a respective plurality of die sites 402 (402aa ... 402jj) having 30°-60°-90° triangular geometric configurations.

By way of a practical illustration, consider the case of a four and three tenths inch semiconductor wafer with 30°-60°-90° triangular die sites 402, each die site having an area of one half inch$^2$, (namely comparing favorably with the area of the prior art square dies 102, FIG. 1A). We see that:

1. each die will have three sides measuring 0.9310, 0.5375 and 1.0750 inches;
2. 36 regular die sites 402a ... 402jj occupy an area of 9 inch$^2$;
3. the wafer area is approximately 14.5 inches.

This yields a wafer-layout-efficiency $E_w$ on the order of 0.62, for 30°-60°-90° triangular die sites (see FIG. 4A), as contrasted with 0.63 for square die sites (See FIG. 1A). In other words, the wafer-layout-efficiency of 30-60-90 triangular die sites is on the order of 1% lower than for square dies. Although a 30°-60°-90° triangular die does not have an appreciably different wafer-layout-efficiency, as contrasted with square dies, the die-topology-efficiency will increase noticeably, as shown herein below.

Die-Topology-Efficiency

FIG. 4B shows an individual 30°-60°-90° die 450, such as a die 402 (FIG. 4A), having three side edges 452, 454, and 456. The die 450 has a total area (one half base multiplied by height) equalling the sum of a central active element area 460 and an I/O area 462 surrounding the active element area 460 and extending to the three side edges of the die. The I/O area 462 is shown as the area outside of the dashed line 464. A plurality of bond pads 466 (only five shown) are disposed about the periphery of the die 450 in the I/O area 462. The active element 460, illustrative of many circuit elements, is shown interconnected by lines 470 to the bond pads 466.

Theoretical Die-Topology-Efficiency (Perimeter:Area)

By way of a theoretical application to demonstrate the present invention, consider the case of a prior art square die having an area of one "unit$^2$". Each side of the square die site will measure one "unit". For a square die having four sides, each measuring one unit, the perimeter is four units, and the ratio of perimeter to area is 4:1.

For a 30°-60°-90° triangular die having an area of one unit$^2$, the three side dimension will measure 2.149 units, 1.861 units, and 1.075 units, and the perimeter will measure 5.085 units. Therefore, the ratio of perimeter to area is 5.085:1, or approximately 27% more perimeter than that of the prior art square die having the same area. Thus, according to the present invention, 30°-60°-90° triangular dies provide increased periphery per area for increasing the number of bond pads that can be disposed in the I/O area.

Practical Die-Topology-Efficiency (I/O Area:Active Element Area)

Referring back to FIG. 4B for a practical illustration of determining the die-topology-efficiency $E_D$, the size of the die bond pads 466 is on the order of 0.004 inches (100 μm), per side, and the pads are spaced apart from one another on the order of 0.002 inches (50 μm). The I/O area 462 typically measures 0.010 inches wide, to allow for formation of the bond pads 466, and extends around the periphery of the die.

The total area of the 30°-60°-90° triangular die will remain at one half inch$^2$ (same area as the prior art square die). Also, each side of the 30°-60°-90° triangle will measure approximately 1.0746, 0.9306, and 0.5373 inches, yielding a perimeter of 2.5425 inches. Thus, according to the present invention, the 30°-60°-90° triangular die will yield 420 bond pads, an increase of approximately 28% over the prior art square die (329 bond pads).

The active element area 460 of the die 450 is 0.2254 inch$^2$, which compares favorably with the active element area (0.2304 inch$^2$) of the square die 150 (FIG. 1A).

The I/O area 462 of the 30°-60°-90° triangular die will be 0.0246 inch$^2$, an increase of 27% over the I/O area (0.0196 inch$^2$) of a square die (150). Moreover, the die-topology-efficiency ($E_D$) of the 30°-60°-90° triangular die 450 is 0.109, as compared with that (0.085) of a square die (150). Therefore, according to the present invention, a 30°-60°-90° triangular die will have a die-topology-efficiency 28% greater than the prior art square die, therefore meeting the industry need of increased number of bond pads.

By way of summary, for the 30-60-90 triangular die 450 (402, FIG. 4A):

(a) the "total area" is 0.2500 inch$^2$;

(b) the "active element area" is 0.2254 inch$^2$;

(c) the "I/O area" is 0.246 inch$^2$;

(d) the total periphery is 2.543 inches, a 27% increase;

(e) number of bond pads is 420, a 28% increase;

(f) die-topology-efficiency, $E_D$ is 0.109, a 28% increase.

Therefore, according to the invention, although 30°-60°-90° triangular dies provide a wafer-layout-efficiency $E_w$, equal to 0.62 (1% decrease), the die-topology efficiency $E_D$, 0.109, provides a 28% increase, hence, producing an increase in the number of pads that can be disposed in the I/O bond pad area, vis-a-vis a square die.

GREATLY ELONGATED RECTANGULAR DIES SCRIBED IN A SEMICONDUCTOR WAFER

Figure 5A:
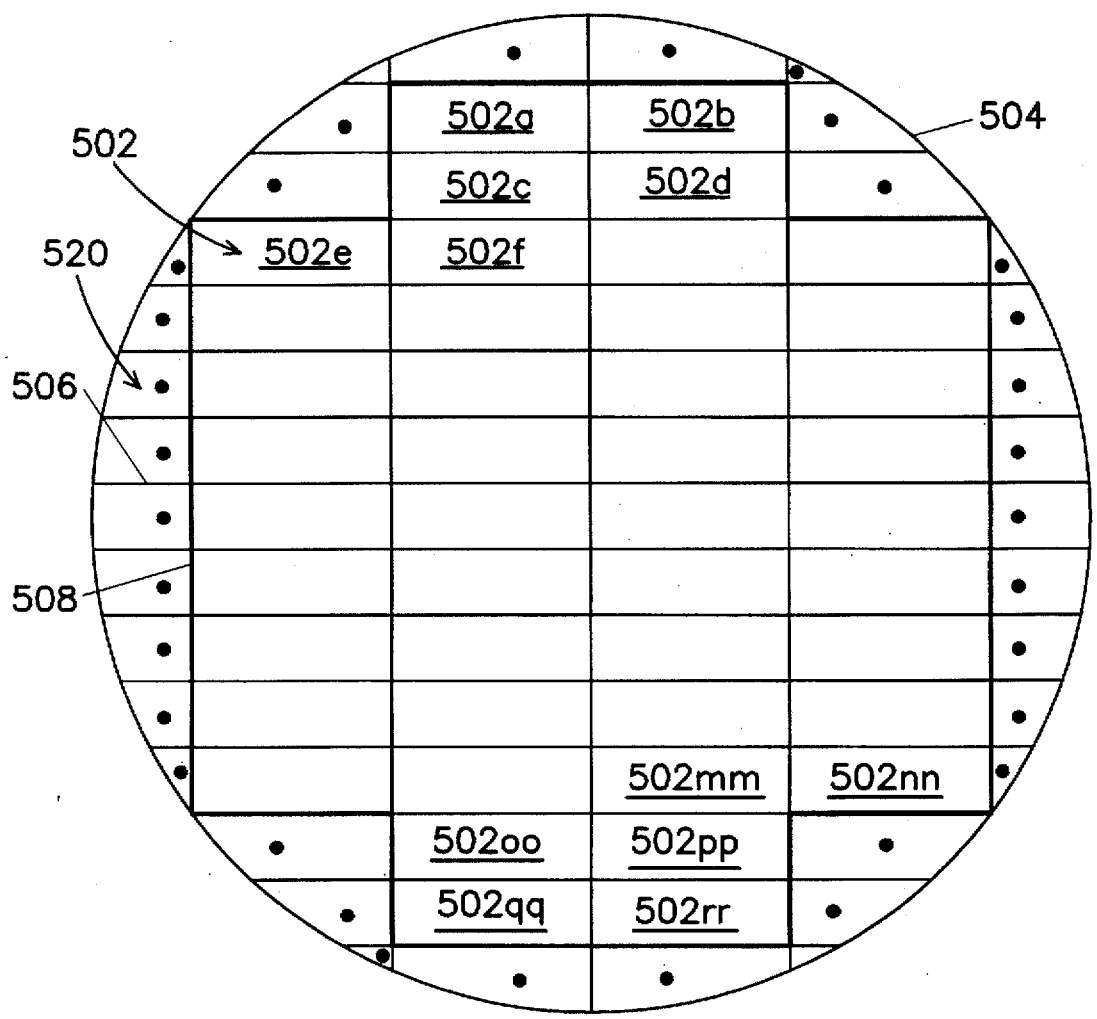
FIG. 5A is a diagrammatic representation of a semiconductor wafer, scribed to form elongated rectangular die sites, according to another embodiment of the present invention.
Figure 5B:
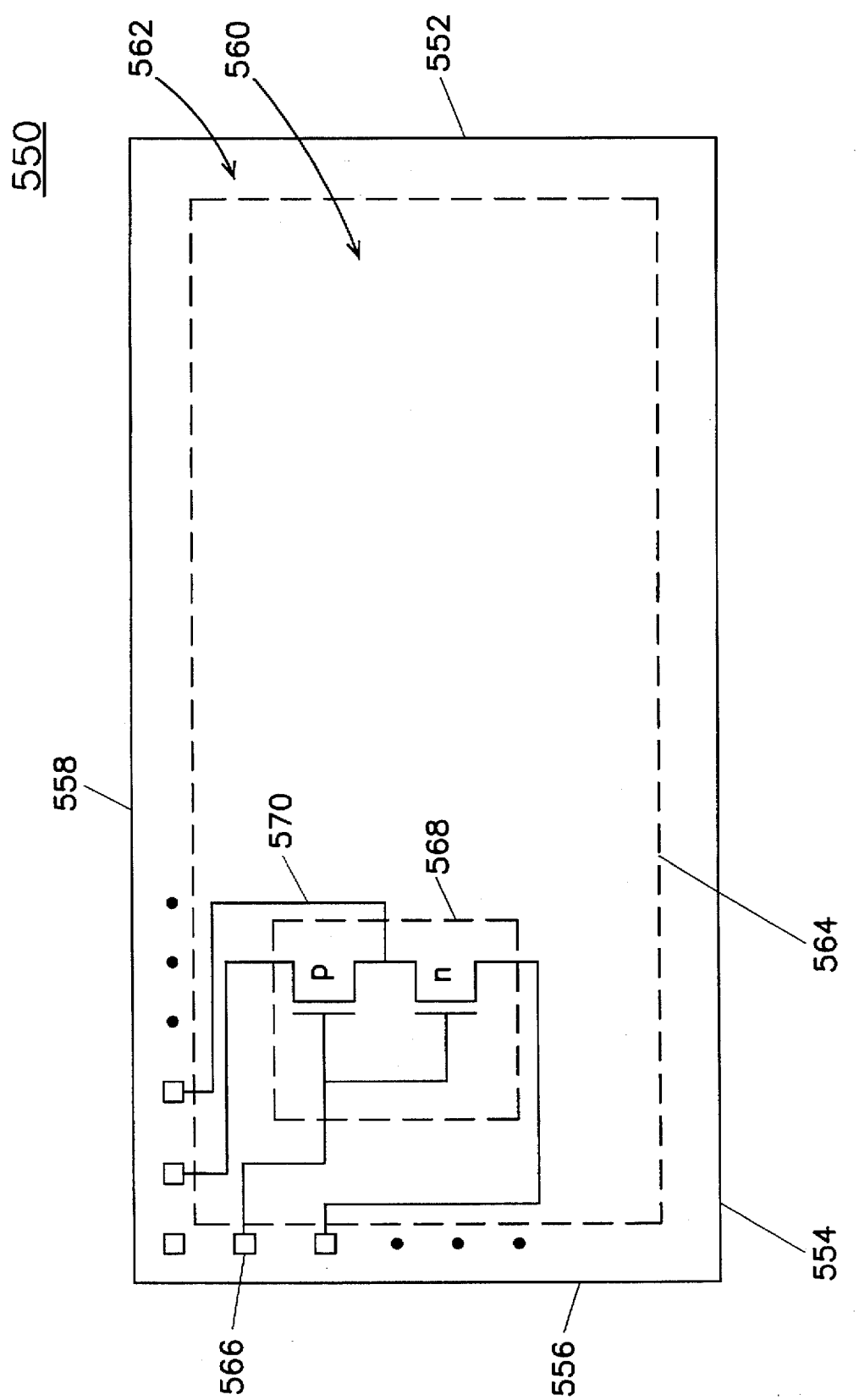
FIG. 5B is a diagrammatic representation of a single elongated rectangular die, singulated from the wafer of FIG. 5A.

FIGS. 5A and 5B show an alternate embodiment of the invention, whether the dies are formed as greatly elongated rectangles (i.e., as "certain non square dies"). The geometric configuration of this embodiment will increase the wafer layout efficiency and the die-topology-efficiency.

In the main, hereinabove, square prior art dies have been discussed. It is not uncommon that prior art dies are rectangular, typically having a base (length) dimension approximately twice the height (width) dimension. These are termed, herein, "2×1" (two by one) rectangular dies. For laying out 2×1 rectangular dies on a wafer, an orthogonal grid of scribe lines extend on the wafer between the individual dies. More importantly, vis-a-vis the present invention.

(a) 2×1 rectangular dies lay out relatively as poorly as square dies on a round wafer, having low wafer-layout-efficiency $E_w$; and (b) 2×1 rectangular dies have a relatively poor ratio of I/O area to active element area, having low die-topology-efficiency $E_D$.

According to the present invention, a "greatly elongated" rectangular die approaches a two-sided geometric shape. (The "limiting" case of an elongated rectangle being a rectangle having zero height—in other words, a line). According to the invention, greatly elongated rectangular dies have a base that is three or more times their height—for example a base three times the height, "3×1" rectangular does.

Wafer-Layout-Efficiency, $E_w$

FIG. 5A shows a technique 500, according to the present invention, for layout out greatly elongated rectangular shaped dies 502 on a semiconductor wafer 504. As in FIG. 1A, a number (forty four shown) of die sites 502, namely 502aa . . . 502rr, are "regular" in the sense that they are all intended to be (or capable of being) processed into working integrated circuit devices, and a number of die sites 520 (marked with a dot) are "irregular" in the sense that they are not intended to be processed into working integrated circuit devices. In marked contrast, however, to the layout of FIG. 1A, the layout of FIG. 5A provides for an increased number of "regular" die sites per wafer, with reduced wasted wafer real estate.

In order to create a greatly elongated rectangular die sites 502a . . . 502rr on a semiconductor wafer, the wafer 504 is scribed in two directions. More particularly, the following method is used for forming greatly elongated rectangular dies 502 on a semiconductor wafer 504:

(a) providing a first series of substantially equally spaced-apart parallel scribe lines 506 chordwise across a semiconductor wafer 504;

(b) providing a second series of substantially equally spaced-apart parallel scribe lines 508 chordwise across the semiconductor wafer 504 intersecting the first series of a parallel scribe lines at an angle "Θ" substantially (i.e., +/− five degrees) equal to ninety degrees.

The plurality of areas enclosed by the first scribe lines 506 and the second scribe lines 508 define a respective plurality of greatly elongated rectangular die sites 502. Each greatly elongated die site 502 having first two opposed side edges (554, 558; FIG. 5B) of a first dimension "x" and second two opposed side edges (552, 556; FIG. 6B) of a second dimension "y" wherein the first dimension "x" is three times greater than the second dimension "y".

According to the present invention, "greatly elongated" rectangles having a first dimension at least three times greater than a second dimension exhibit favorable die-topology-efficiency. As the ratio of first dimension ("x") to second dimension ("y") increases, beyond three, this die-topology-efficiency becomes greater and greater. For example, a first dimension five times greater than the second dimension exhibits a dramatic increase in die-topology-efficiency. The following ratios of first dimension ("x") to second dimension ("y") are expressly intended to be included in the definition of "at least three times greater": 3:1 (discussed in the main hereinafter; 3.5:1; 4.0:1; 4.5:1 and 5.0:1.

By way of a practical illustration, consider the case of a four and three tenths inch (4.3) semiconductor wafer with greatly elongated (3×1) die sites 502, each die site having an area of one half inch$^2$, (namely comparing favorable with the area of the prior art square dies 102, FIG. 1A). We see that:

1. each die will have two sides measuring 0.2887 inches, and two sides measuring 0.8661 inches;
2. 44 regular die sites 502a . . . 502rr occupy an area of 11 inch$^2$;
3. the wafer area is approximately 14.5 inches.

This yields a wafer-layout-efficiency $E_W$ on the order of 0.76, for greatly elongated rectangular die sites (FIG. 5A), as contrasted with 0.63 for square die sites (See FIG. 1A). In other words, the wafer-layout-efficiency of greatly elongated rectangular die sites is on the order of 21% higher than for square dies. Therefore, the present invention will provide a 21% increase in the number of semiconductor devices that can be laid out on a wafer.

Die-Topology-Efficiency

FIG. 5B shows an individual greatly elongated rectangular die 550, such as a die 502 (FIG 5A), having four side edges 552, 554, 556, and 558. The die 550 has a total area (base multiplied by height) equalling the sum of a central active element area 560 and an I/O area 562 surrounding the active element area 560 and extending t the four side edges of the die. The I/O area 562 is shown as the area outside of the dashed line 564. A plurality of bond pads 566 (only five shown) are disposed about the periphery of the die 550 in the I/O area 562. The active element area 560 contains circuit elements. A circuit element 568, illustrative of many circuit elements, is shown interconnected by lines 570 to the bond pads 566.

Theoretical Die-Topology-Efficiency (Perimeter:Area)

By way of a theoretical application to demonstrate the present invention, consider the case of a prior art square die having an area of one "unit$^2$". Each side of the square die will measure one "unit". For a square die having four sides, each measuring one unit, the perimeter measures four units, and the ratio of perimeter to area is 4:1.

For a greatly elongated "3×1" rectangular die having an area of one unit$^2$, the four side dimensions will measure 0.577, 0,.577, 1.733 and 1.733 units, and the perimeter will be 4.620 units. Therefore, the ratio of perimeter to area is 4.620:1, or approximately 15% perimeter more than that of the prior art square die having the same area. Thus, according to the present invention, greatly elongated rectangular dies provide increased periphery per are for increasing the number of bond pads that can be disposed in the I/O area.

Practical Die-Topology Efficiency (I/O Area:Active Element Area)

Referring back to FIG. 5B for a practical illustration of determining the die-topology efficiency $E_D$, the size of the die bond pads 566 is on the order of 0.004 inches (100 μm), per side, and the pads are spaced apart from one another on the order of 0.002 inches (50 μm). The I/O area 562 typically measures 0.010 inches wide, to allow for formation of the bond pads 566, and extends around the periphery of the die.

The total area of the greatly elongated rectangular die will remain at one quarter inch$^2$ (same area as the prior art square die). Also, the four sides of the greatly elongated rectangular die will measure approximately 0.2887, 0.2887, 0.8660 and 0.8660 inches, yielding a perimeter of 2.3094 inches. Thus, according to the present invention, the greatly elongated rectangular die will yield 380 bond pads, an increase of approximately 16% over the prior art square die (329 bond pads).

The active element area 560 of the die 550 is 0.2273 inch$^2$, which compares favorably with the active element area (0.2304 inch$^2$) of the square die 150 (FIG. 1A).

The I/O area 562 of the greatly elongated rectangular die will be 0.0227 inch$^2$, an increase of 16% over the I/O area (0.0196 inch$^2$) of a square die (150). Moreover, the die-topology-efficiency ($E_D$) of the greatly elongated rectangular die 550 is 0.100, as compared with that (0.085) of a square die (150). Therefore, according to the present invention, a greatly elongated rectangular die will have a die-topology-efficiency 17% greater than the prior art square die, therefore meeting the industry need of increased number of bond pads.

By way of summary, for the greatly elongated rectangular die, 550 (502, FIG. A):

(a) the "total area" is 0.2500 inch$^2$;

(b) the "active element area" is 0.2273 inch$^2$;

(c) the "I/O area" is 0.0227 inch$^2$;

(d) the total periphery is 2.3094 inches, a 16% increase;

(e) number of bond pads is 380, a 16% increase;

(f) die-topology-efficiency, $E_D$ is 0.100, a 17% increase.

Therefore, according to the invention, greatly elongated rectangular dies produces an increase in both wafer layout-efficiency $E_W$, and in die-topology efficiency $E_D$.

PARALLELOGRAM-SHAPED DIE SCRIBED IN A SEMICONDUCTOR WAFER

Figure 6A:
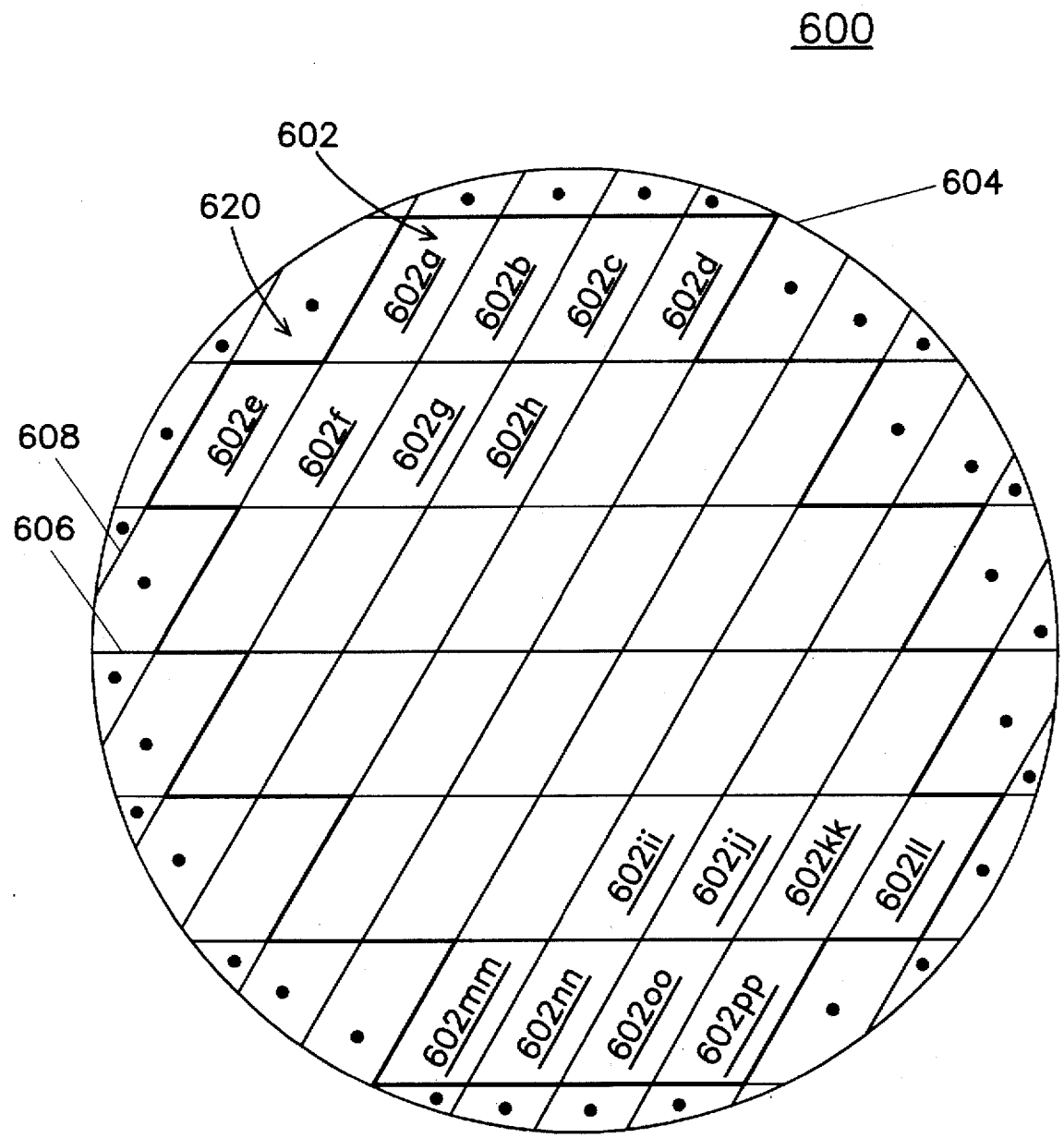
FIG. 6A is a diagrammatic representation of a semiconductor wafer, scribed to form parallelogram-shaped die sites, according to another embodiment of the present invention.
Figure 6B:
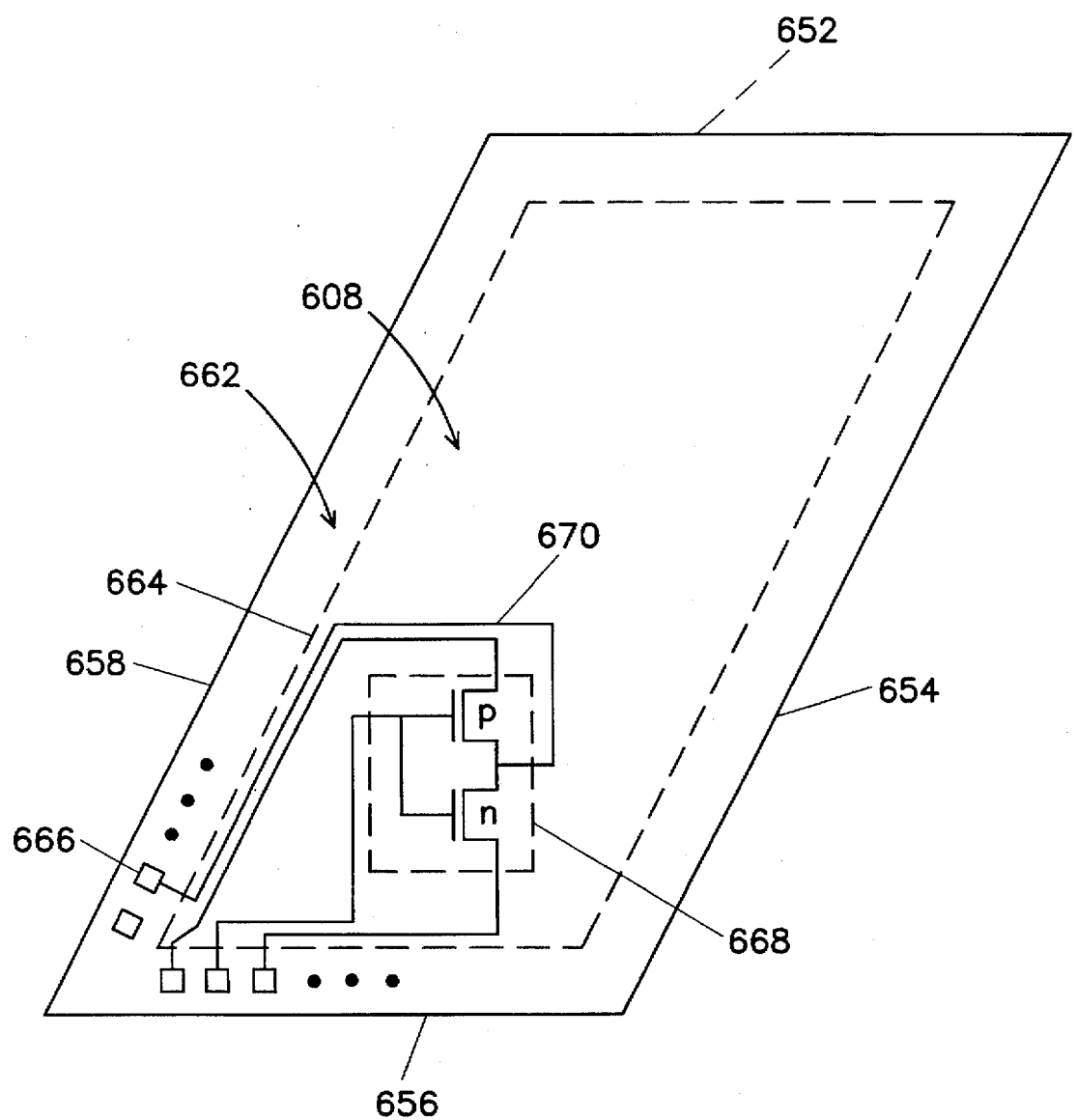
FIG. 6B is a diagrammatic representation of a single parallelogram-shaped die, singulated from the wafer of FIG. 6A.

FIGS. 6A and 6B show an alternate embodiment of the invention, wherein dies are formed as parallelogram-shaped rectangles. The geometric configuration of this embodiment will also increase both the wafer-layout-efficiency and the die-topology-efficiency.

FIG. 6A shows a technique 600, according to the present invention, for laying out parallelogram shaped dies 602 on a semiconductor wafer 604. As in FIG. 1A, a number (forty two shown) of die sites 602, namely 602a . . . 602pp are "regular" in the sense that they are all intended to be (or capable of being) processed into working integrated circuit devices, and a number of die sites 620 (marked with a dot)

are "irregular" in the sense that they are not intended to be processed into working integrated circuit devices. In marked contrast, however, to the layout of FIG. 1A, the layout of FIG. 6A provides for an increased number of "regular" die sites per wafer, with reduced wasted wafer real estate (irregular die sites).

In order to create the parallelogram shaped die sites 602a . . . 602pp on a semiconductor wafer, the wafer 604 is scribed in two directions. More particularly, the following method is used for forming parallelogram shaped dies 602 on a semiconductor wafer 604:

(a) providing a first series of substantially equally spaced-apart parallel scribe lines 606 chordwise across a semiconductor wafer 602;

(b) providing a second series of substantially equally spaced-apart parallel scribe lines 608 chordwise across the semiconductor wafer 602 intersecting the first series of parallel scribe lines 606 at a diagonal angle "Θ" substantially (+/– five degrees) non-equal to ninety degrees.

The plurality of areas enclosed by the first scribe lines 606 and the second scribe lines 608 define a respective plurality of parallelogram-shaped die sites 602 (602a . . . 602pp). also, the angles Θ, at which the second series of parallel scribe lines 608 intersects the first series of parallel scribe lines 606, is typically equal to sixty degrees. However, other angle Θ may also be used to for parallelogram-shaped dies, including Θ equal to 30°, 120°, and 150°, Finally, it can be seen from FIG. 6A that the plurality of parallelogram-shaped die sites 602, in aggregate, fit more efficiently into the round area of the wafer 604 (as compared with the fit of the square die sites of FIG. 1A).

By way of a practical illustration, consider the case of a 4.45 inch semiconductor wafer with parallelogram shaped rectangular die sites 602, each site having an area of one half inch$^2$, (namely comparing favorably with the area of the prior art square dies 102, FIG. 1A). We see that:

1. each die will have two sides measuring 0.7598 inches, and two sides measuring 0.6580 inches;
2. 42 regular die sites 602a . . . 602pp occupy an area of 0.25 inch$^2$;
3. the wafer area is approximately 15.6 inches.

This yields a wafer-layout-efficiency $E_w$ on the order of 0.67, for parallelogram-shaped die sites (FIG. 6A), as contrasted with 0.63 for square die sites (See FIG. 1A). In other words, the wafer-layout-efficiency of parallelogram shaped die sites is on the order of 6% higher than for square dies. Therefore, the present invention will provide a 6% increase in the number of semiconductor devices that can be laid out on a wafer.

Die-Topology-Efficiency

FIG. 6B shows an individual parallelogram shaped die 650, such as a die 602 (FIG. 6A), having four side edges 652, 654, 656, and 658. The die 650 has a total area equalling the sum of a central active element area 660 and an I/O area 662 surrounding the active element area 660 and extending to the four side edges of the die. The I/O area 662 is shown as the area outside of the dashed line 664. A plurality of bond pads 666 (only five shown) are disposed about the periphery of the die 650 in the I/O area 562. The active element area 660 contains circuit elements. A circuit element 668, illustrative of many circuit elements, is shown interconnected by lines 670 to the bond pads 666.

Theoretical Die-Topology-Efficiency (Perimeter:Area)

By way of a theoretical application to illustrate the present invention, consider the case of a prior art square die having an area of one "unit$^2$". For a square die having four sides, each measuring one unit, the perimeter was four units, and the ratio of perimeter to area is 4:1.

For a sixty degree parallelogram-shaped rectangular die having an area of one unit$^2$, the side dimensions will measure 1.520, 1.520, 0.759, and 0.759 units, and the perimeter will measure 4.56 units. Therefore, the ratio of perimeter to area is 4.56:1, or approximately 14% perimeter more than that of the prior art square die having the same area. Thus, according to the present invention, parallelogram shaped provide more periphery per area than prior art square dies.

Practical Die-Topology Efficiency (I/O Area:Active Element Area)

Referring back to FIG. 6B for a practical illustration of determining the die-topology efficiency $E_D$, the size of the die bond pads 666 is on the order of 0.004 inches (100 μm), per side, and the pads are spaced apart from one another on the order of 0.002 inches (50 μm). The I/O area 662 typically measures 0.010 inches wide, to allow for formation of the bond pads 666, and extends around the periphery of the die.

The total area of the parallelogram-shaped die will remain at one quarter inch$^2$ (same area as the prior art square die). Also, the four sides of the parallelogram shaped die will be approximately 0.3799, 0.3799, 0.7598 and 0.7598 inches, yielding a perimeter of 2.279 inches. Thus, according to the present teaching, the parallelogram shaped die will yield 376 bond pads, an increase of approximately 14% over the prior art square die (329 bond pads).

The active element area 660 of the die 650 is 0.2279 inch$^2$, which compares favorably with the active element area (0.2304 inch$^2$) of the square die 150 (FIG. 1A).

The I/O area of the parallelogram shaped die will measure 0.0221 inch$^2$, an increase of 13% over the I/O area (0.0196 inch$^2$) of a square die (150). Moreover, the die-topology-efficiency ($E_D$) of the equilateral triangle die 650 is 0.097, as compared with that (0.085) of a square die (150). Therefore, according to the present invention, a parallelogram shaped die will have a die-topology-efficiency 14% greater than the prior art square die, therefore meeting the industry need of increased number of bond pads.

By way of summary, for the parallelogram shaped die, 650 (602, FIG. A):

(a) the "total area" is 0.2500 inch$^2$;

(b) the "active element area" is 0.2279 inch$^2$;

(c) the "I/O area" is 0.0221 inch$^2$;

(d) the total periphery is 2.2798 inches, a 14% increase;

(e) number of bond pads is 376, a 14% increase;

(f) die-topology-efficiency, $E_D$ is 0.097, a 14% increase.

Thus, we see that parallelogram shaped die provide both an increase in wafer layout-efficiency $E_w$, and an increase in die-topology-efficiency $E_D$, vis-a-vis square dies, hence, providing for (1) more die sites per semiconductor wafer and (2) an increase in the number of bonding pads that can be obtained in the I/O area.

CERTAIN OTHER NON-SQUARE DIES

As shown above, certain non-square dies, including triangular-shaped (equilateral, right isosceles, 30°-60°-90°), greatly elongated rectangular shaped dies, and parallelogram shaped dies provide for an increase in either wafer-layout-efficiency, die-topology-efficiencies, or both. Moreover, these certain non-square does are "scribable" in the sense that all the regular die sites can be completely scribed while on a semiconductor wafer, and they are "homogeneous" in the sense that all of the regular die sites contain the same circuitry.

Put another way, the various embodiments of the invention set forth above all satisfy "normal" design criteria of:
1. the "regular" (used for integrated circuitry) dies are identical to one another ("homogeneous"); and
2. the "regular" die are capable of being singulated from the wafer by chordwise scribe lines ("scribable") provided on the wafer.

These two criteria certainly reflect the "conventional" wisdom with regard to semiconductor manufacture. However, according to the present invention, dies can also be "non-homogenous") in the sense that they are not identical (FIG. 7 and 8), and dies can also be "non-scribably" in the sense that they are not capable of being singulated from the wafer by chordwise scribe lies (FIG. 9).

Figure 7A:
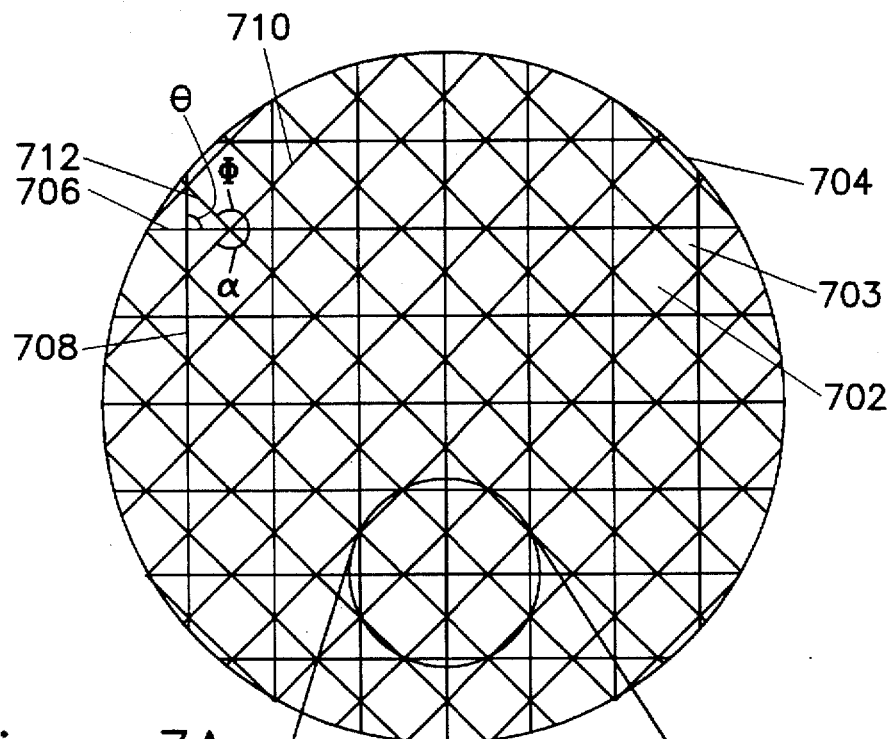
FIG. 7A is a diagrammatic representation of a semiconductor wafer, described to form dissimilar shaped die sites, according to another embodiment of the present invention.

FIG. 7A shows a technique 700, according to the present invention, wherein a wafer 700 is scribed with a repeating pattern of non-homogeneous "regular" die sites, including square dies 702 and right isosceles triangular dies 703. According to the invention, the dies 702 and 703 are not identical, hence, require different circuitry (not shown). They are "non-homogeneous". The combination of square dies and triangular dies exhibit improved wafer layout efficiency, according to the principles set forth hereinabove. Further, the triangular dies 703 exhibit an improved ratio of I/O area to active element area, as set forth hereinabove with respect to FIG. 3B.

In order to create non-homogeneous dies sites 702 and 703 on a semiconductor wafer 704, the wafer is scribed in four directions. More particularly, the following method is used for forming non-homogeneous dies 702 and 703 on a semiconductor wafer 704:

(a) providing a first series of parallel, substantially equally spaced-apart parallel scribe lines 706 chordwise across the semiconductor wafer;

(b) providing a second series of substantially equally spaced-apart parallel scribe lines 708 chordwise across the semiconductor wafer intersecting the first series of parallel scribe lines 706 at a first angle "α" substantially equal to ninety degrees;

(c) providing a third series of substantially equally spaced-apart parallel scribe lines 710 chordwise across the semiconductor wafer 704 intersecting the first series of parallel scribe lines 706 at a second angle "Θ", said second angle "Θ" being positive and different than the first angle "α";

(d) providing a fourth series of substantially equally spaced-apart parallel scribe lines 712 chordwise across the semiconductor wafer intersecting the first series of parallel scribe lines 706 at a third angle "φ", said third angle "φ" being different than the first angle "α" and different than the second angle "Θ".

The third and fourth series of scribe lines intersect the first an second series of scribe lines at points midway between the points at which the first series of scribe lines intersect the second series of scribe lines.

According to the present invention, a plurality of areas enclosed by the first scribe lines 706, the second scribe lines 708, the third scribe lines 710, and the fourth scribe lines 712 define a respective plurality of non-homogeneous die sites having square (702) and right isosceles (703) shapes. All of the triangular die sites 703 have the same geometrical configuration as one another.

Figure 7B:
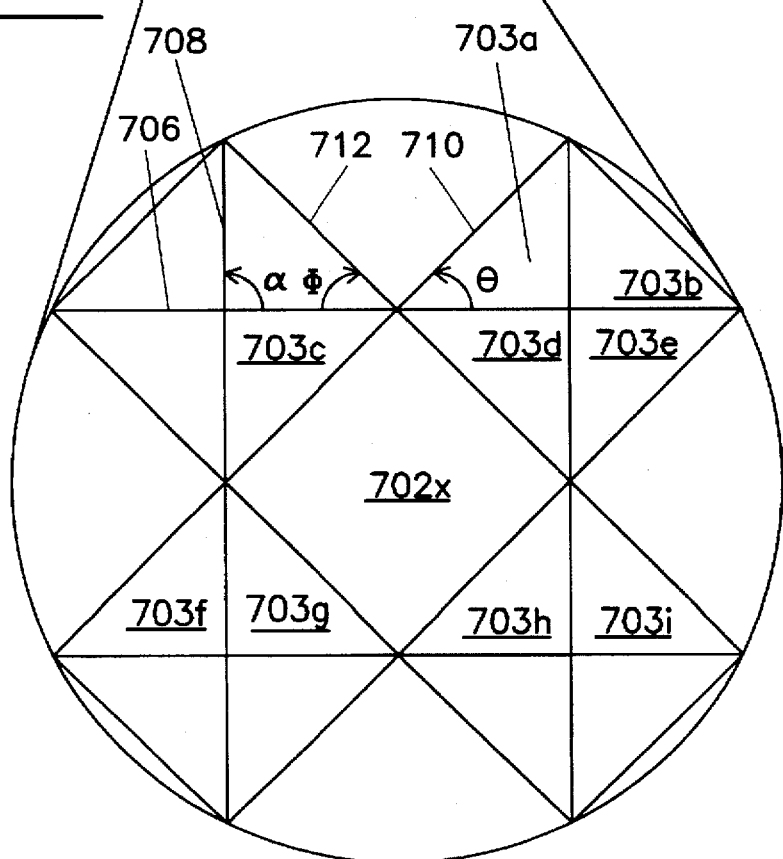
FIG. 7B is a diagrammatic representation of a portion of the semiconductor wafer of FIG. 7A.

FIG. 7B shows an arbitrary selected portion of the dies 702 and 703. A single square die 702x is shown surrounded by a number of triangular dies 703a ... 703i. It will be seen, hereinbelow, that various patterns of the square dies and neighboring triangular dies are repeating, over the surface of the wafer.

Figure 8A:
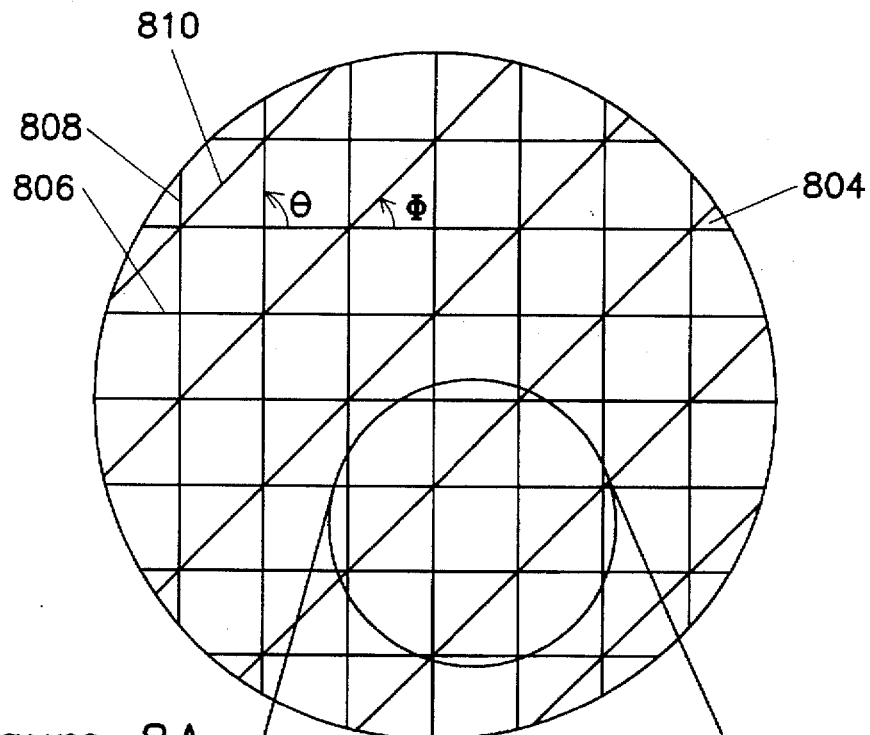
FIG. 8A is a diagrammatic representation of a semiconductor wafer, scribed to form other dissimilar shaped die sites, according to another embodiment of the present invention.

FIG. 8A shows a technique 800, according to the present invention, wherein a wafer is covered with non-homogeneous "regular" die sites, including a plurality of square dies 802 and right isosceles triangular dies 803. According to the invention, dies 802 and 803 are not identical, hence they will contain different circuitry (not shown). In order to create the non-homogeneous dies sites 802 and 803 on the semiconductor wafer 804, the wafer is scribed in three directions. More particularly, the following method is used for forming the non-homogeneous dies 802 and 803 on a semiconductor wafer 804:

(a) providing a first series of parallel, substantially equally spaced-apart parallel scribe lines 806 chordwise across the semiconductor wafer;

(b) providing a second series of substantially equally spaced-apart parallel scribe lines 808 chordwise across the semiconductor wafer intersecting the first series of parallel scribe lines 806 at a first angle "Θ" substantially equal to ninety degrees;

(c) providing a third series of substantially equally spaced-apart parallel scribe lines 810 chordwise across the semiconductor wafer intersecting every other intersection of the first and second series of parallel scribe lines 806 and 808 at a second angle "φ" substantially equal to positive forty five degrees with respect to the first series of scribe lines;

According to the present invention, a plurality of areas enclosed by the first scribe lines 806, the second scribe lines 808, the third scribe lines 810 define a respective plurality of non-homogeneous die sites having square (802) and right isosceles (803) shapes. The combination of square dies and triangular dies exhibit improved wafer layout efficiency, according to the principles set forth hereinabove. Further, the triangular die sites 803 exhibit an improved ratio of I/O area to active element area, as set forth hereinabove with respect to FIG. 3B.

Figure 8B:
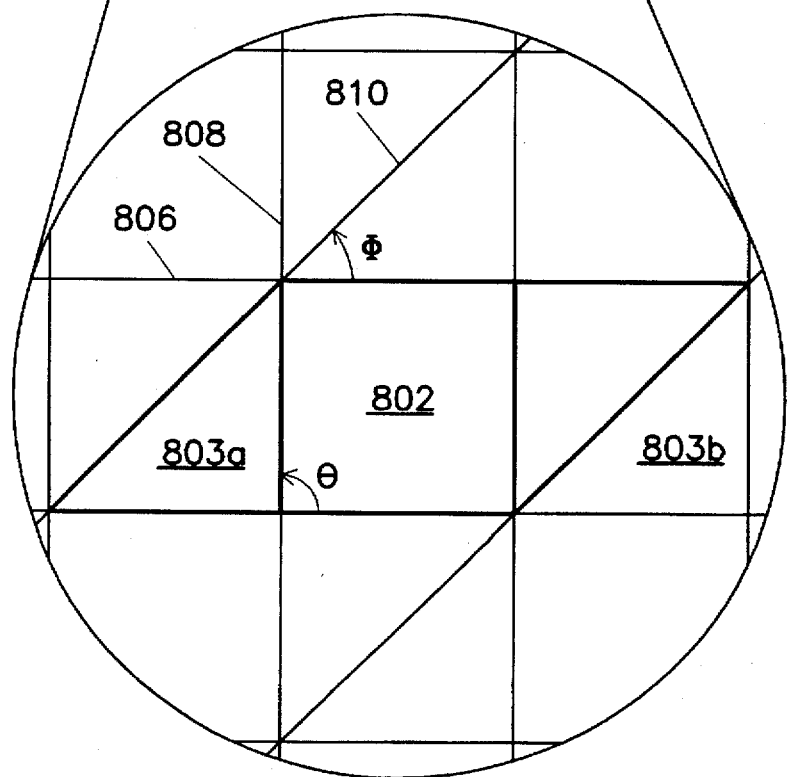
FIG. 8B is a diagrammatic representation of a portion of the semiconductor wafer of FIG. 8A.

FIG. 8B shows selected square dies 802 and neighboring triangular dies 803a and 803b. It will be seen, hereinbelow, that various patterns of the square dies and neighboring triangular dies are repeating, over the surface of the wafer.

Figure 9A:
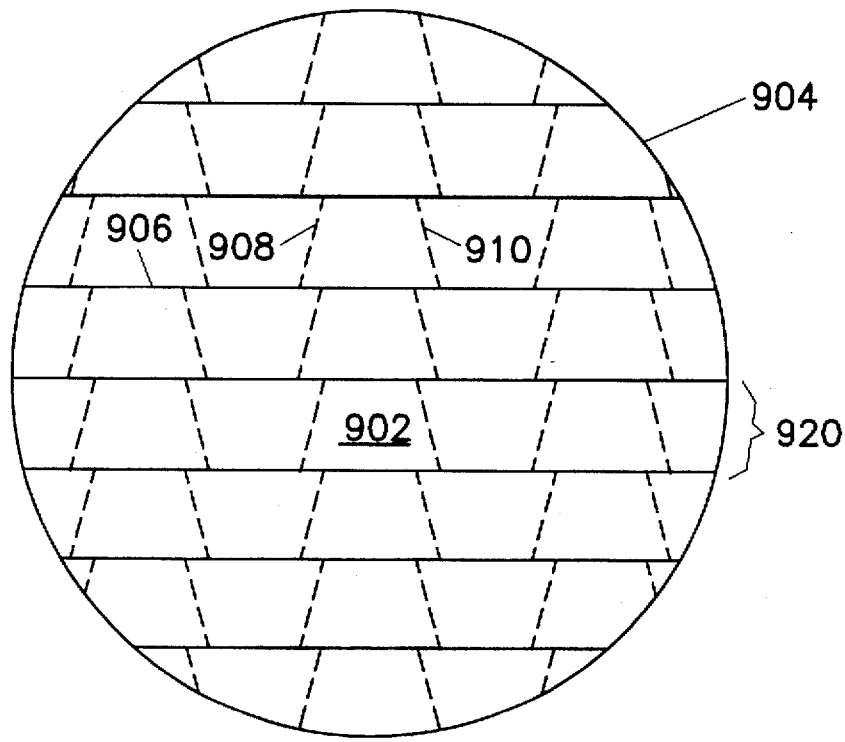
FIG. 9A is a diagrammatic representation of a semiconductor wafer, showing the layout of non-scribable dies.

FIG. 9A shows a technique 900, according to the present invention, wherein "non-scribable" homogeneous trapezoid-shaped die sites 902 are formed on a wafer 904. As mentioned hereinabove, the "conventional" process for scribing "regular" die sites involves chordwise (with respect to the wafer) scribe lines. However, it is easily seen in FIG. 9A that the dies 902 cannot be formed in this manner. In other words, the trapezoid-shaped die sites 902 cannot be formed solely by chordwise mechanical scribing on the wafer.

According to the present invention, the following method is used for forming trapezoid-shaped die sites 902:

A first series of substantially equally spaced-apart parallel scribe lines 906 extend chordwise across the wafer 904. These scribe lines partially define the die sites 902. (The scribe lines 906 define only two opposite edges, or sides, of the dies, which are ultimately singulated to have four sides.) It bears mention that the circuitry for each die (not shown) is formed (as in all cases) while the dies are un-singulated on the wafer.

Figure 9B:
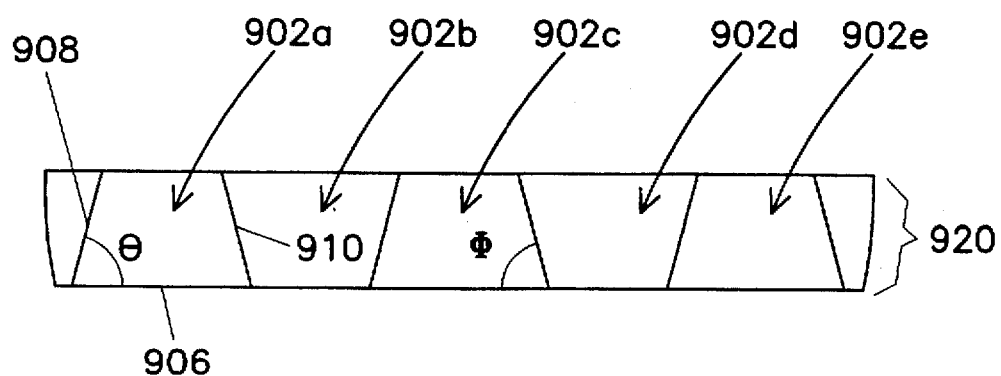
FIG. 9B is a diagrammatic representation of a row of dies separated from the semiconductor wafer of FIG. 9A, scribed to form a plurality of trapezoidal-shaped dies, according to another embodiment of the present invention.

Areas of the wafer between adjacent scribe lines 906 are classified as "rows". FIG. 9B show one such row of partially scribed dies 902. Each row has two opposite edges defined by a one and an adjacent scribe line 906.

The rows are separated, row-by-row from the wafer, as indicated by the row 920 in FIG. 9B. These are :separated" rows. One separated row 920 is shown in FIG. 9B.

After separating the rows from the wafer, each separated row is further scribed to further define the individual die sites for the row. As shown in FIG. 9B, a second series of scribe lines 908 are provided at a positive diagonal angle "Θ" with respect to the edge of the row (the edge of the row being formed by a first scribe line). Also, a third series of scribe lines 910 are provided at a negative diagonal angle "ϕ" with respect to the edge of the row. In this manner, trapezoid die sites can be further (completely) scribed (the angles Θ and ϕ are equal and opposite, diagonal angles). The trapezoidal die on a row, e.g., the dies 902a, 902b, 902c, 902d, 902e, are of different orientation from one another. One group of dies, e.g., 902a, 902c and 902e are :right side up", and another group of dies, e.g., 902b and 902d are "upside down". In this sense, the dies 902 (generally) are "nonuniformly-oriented".

After scribing (908, 910) the partially scribed die sites on the separated row, the dies are singulated from the row.

FABRICATING CERTAIN NON-SQUARE DIES

As mentioned hereinabove, commonly all of the (regular) dies fabricated on a wafer contain identical circuitry, in other words represent multiple iterations of a single overall circuit pattern. Looking at FIGS. 1A and 1B, it is readily apparent that each of the dies 102 (150) is identical and, although disposed at a different location on the wafer, is oriented in the same direction on the wafer.

As is known, photolithography apparatus, and the like, is used to fabricate the circuit elements on the dies. This involves using a series of "masks", each mask patterned to form particular elements on a single die, and the mask is moved from location-to-location in order to process the plurality of dies in an identical manner to one another.

This is all well and good, if the dies are all the same and are all oriented the same. However, as we have seen, it is possible (according to the present invention) to have dies that are the same and are oriented differently on the wafer.

For example, the does 202a . . . 202pp are all the same shape as one another (see 250, FIG. 2B), and consequently contain the same circuitry, but they are laid out on the wafer with different orientations. For example, the dies 202a, 202c, 202e, 202f, 202h, 202j, 202l, etc. are oriented in the same direction as one another, but they are oriented in a different direction than the dies 202b, 202d, 202g, 202i, 202k, etc. Inasmuch as one group of the dies 202 are oriented the same as one another in one direction, and another group is oriented the same as one another in a different direction, the one group is "dissimilar" from the other group. The dies 202, 302 and 402 are "dissimilar" in that they are "nonuniformly-oriented".

Dies can also be "dissimilar" in that one group of dies is shaped differently from another group, hence contain different circuitry than the other group. FIGS. 7A and 8A exemplify this category. For example, the dies 702 are squares, and the dies [702] 703 are triangular and contain different circuitry than the square dies. The same can be said of the dies 802 vis-a-vis the dies 803. When one group of dies on a wafer is shaped differently than another roup of dies on the wafer, they are termed "non-homogeneous" dies. In the example of FIGS. 7A and 8A, the dies are both "non-homogeneous" and "nonuniformly-oriented".

In either case of "dissimilar" dies, namely "non-homogeneous" and/or "nonuniformly-oriented", traditional photolithography techniques using a single mask pattern are wholly inadequate.

According to the present invention, dies are fabricated either:

(1) using a "composite" mask containing patterns for two or more dissimilar (non-homogeneous or nonuniformly-oriented) dies: or (2) using a mask containing a pattern for one die for fabricating all of the dies having one orientation, and reorienting the mask to fabricate dies having other orientations.

Figure 10:
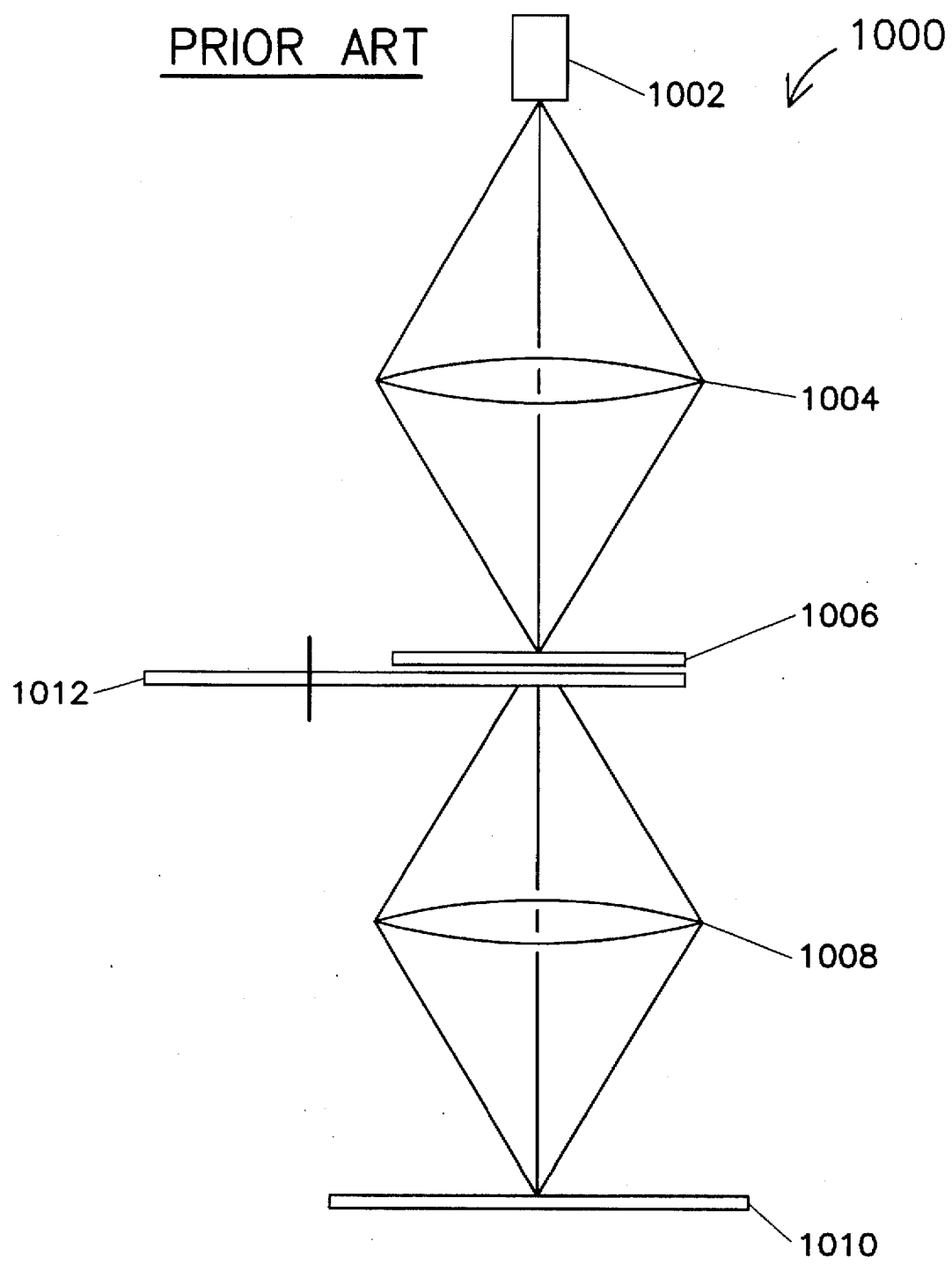
FIG. 10 is a diagrammatic representation of prior art photolithographic apparatus.

FIG. 10A shows photolithography apparatus 1000. Generally, light from an illuminator 1002 is focused through a lens 1004 onto a mask 1006. The mask is provided with a pattern of lines, and the like. An image of the mask patten is focused by another lens 1008 onto a semiconductor wafer 1010. This is all well known and is disclosed, for example, in commonly-owned U.S. Pat. No. 5,055,871, incorporated by reference herein. Generally, the mask 1006 contains one of many patterns required to fabricate a single semiconductor device (die), and in order to fabricate several dies on a wafer, the mask is repositioned from one die site to another.

It is also known to provide a reticle stage 1012 for holding the mask 1006, and other masks (not shown). The other masks would relate to the mask 1006 in that they contain patterns for subsequent processing steps of a single die. The series of masks for the die can be sequentially introduced between the illuminator and the wafer by rotationally positioning the reticle stage.

Consider the case of the dies 202 of FIG. 2A, which are all shaped as equilateral triangles and which all contain the same circuitry. However, the dies 202a, 202c, 202e, etc. are oriented differently than the dies 202b, 202d, etc.

Figure 11A:
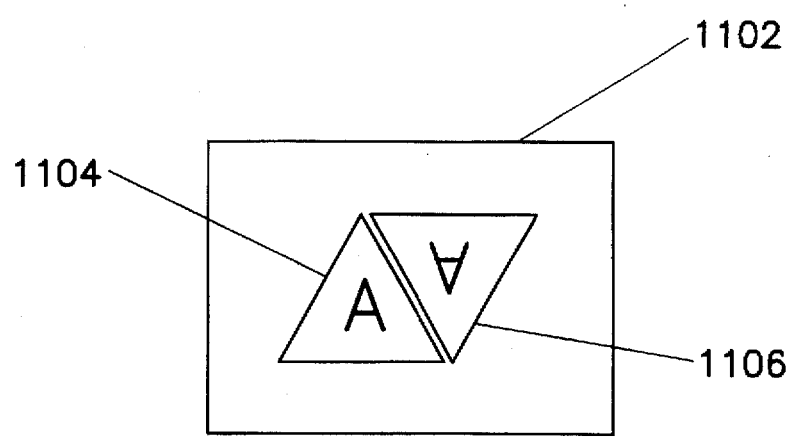
FIG. 11A is a diagrammatic representation of a "composite" mask, according to the present invention, for use in photolithographic apparatus.

FIG. 11A shows a mask 1102 containing patterns for fabricating two nonuniformly-oriented dies. A first pattern 1104 is oriented one way, as indicated by the right-side-up letter "A". Second pattern 1106 is identical to the first pattern, but is oriented differently than the pattern 1104, as indicated by the upside-down letter "A". This mask 1102 is suitable for use as the mask 1006 (FIG. 10), for fabricating the dies 202 of FIG. 2A two-by-two (two at a time). In other words, when there are nonuniformly-oriented dies on a wafer (e.g., 202, 302, 402), it is necessary to fabricate the two or more adjacent dies at a time, using one :composite" mask (e.g., 1102). Creating a composite mask for any suitable repeating pattern of "n" adjacent dies will suffice, although as a general proposition the number "n" of dies should be kept to a minimum (e.g., two).

Figure 11B:
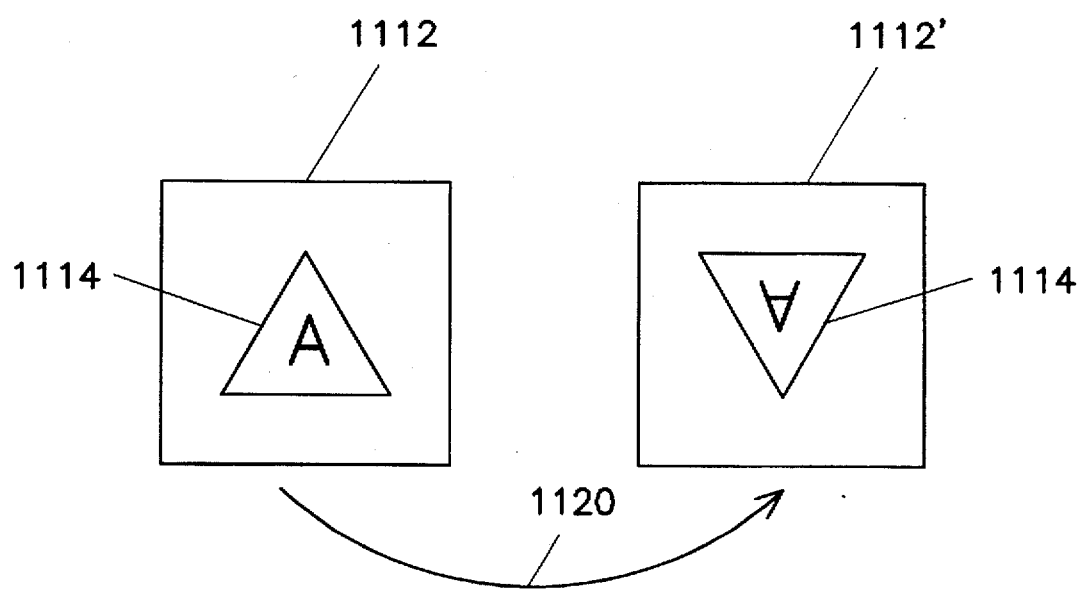
FIG. 11B is a diagrammatic representation of a mask, according to the present invention, for use in photolithographic apparatus.

FIG. 11B shows a mask 1112 containing a pattern 1114 for fabricating a singe die. Using this mask in the apparatus of FIG. 10, all of the similarly oriented dies in one group of dies (e.g., 202a, 202c, 202e, etc.) are exposed. Then the mask is reoriented for exposing the nonuniformly-oriented dies (e.g., 202b, 202d, etc.). This is indicated by an arrow 1120 showing the mask 1112 in a reoriented position 1112'. This differs from the technique shown in FIG. 11A in that a "composite" mask containing patterns for two dies is not needed. It is only needed to reorient the mask for the nonuniformly-oriented dies.

Figure 12A:
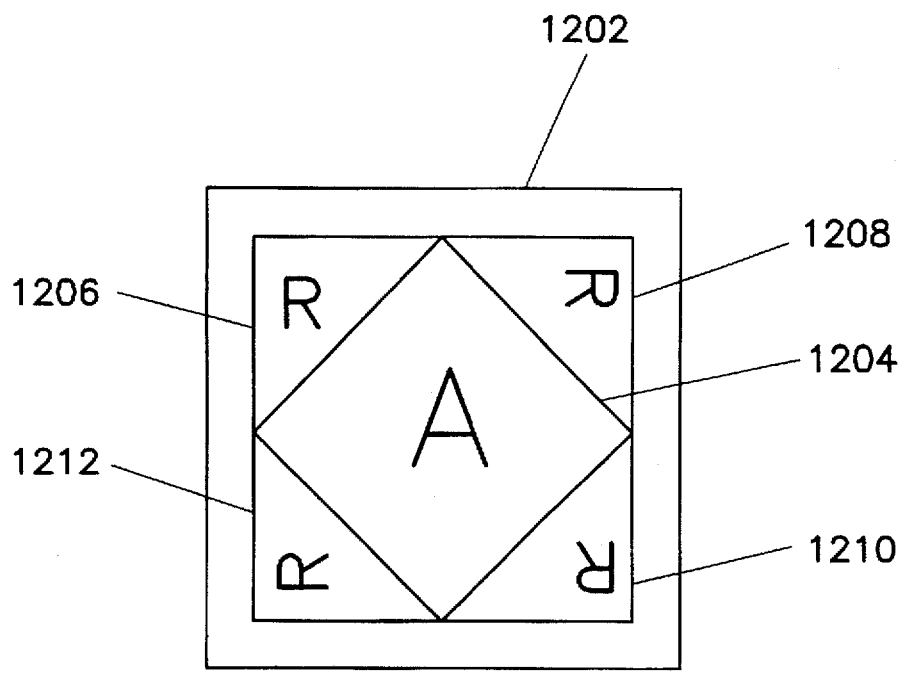
FIG. 12A is a diagrammatic representation of a "composite" mask, according to the present invention, for use in photolithographic apparatus.

FIG. 12A shows a "composite" mask 1202 suitable for exposing non-homogeneous dies (e.g., 702/703, 802/803), and is similar to the mask 1102 of FIG. 12A in that it contains patterns for more than one die, i.e., for non-homogeneous dies.

Consider the case of the dies 702X, 703c, 703d, 703g and 703h, shown in FIG. 7B. This is one possible repeating sequence of dies on the wafer 704. For the die 702x, a pattern 1204 ("A") is formed on the mask. For fabricating the die 703c, a different pattern 1206 (erect "R") is formed on the mask. For the die 703d, another pattern 1208 is formed, which has a pattern for the same circuitry as the pattern 1206 (i.e., "R") but which is oriented differently than the pattern 1206. For fabricating the die 703H, another pattern 1210 is provided—again the same as the pattern "R" (1206) but re-oriented as shown. And, for the die 703g, another pattern 1212 is employed as a re-orientation of the patter 1206. Together, the patterns 1204, 1206, 1208, 1210 and 1212 form a composite mask. As mentioned, it is possible to find another repeating sequences of adjacent dies, such as the dies 702x, 703d, 703e, 703f and 703g, or such as the dies 702x, 703a, 703b, 703d and 703e.

Figure 12B:
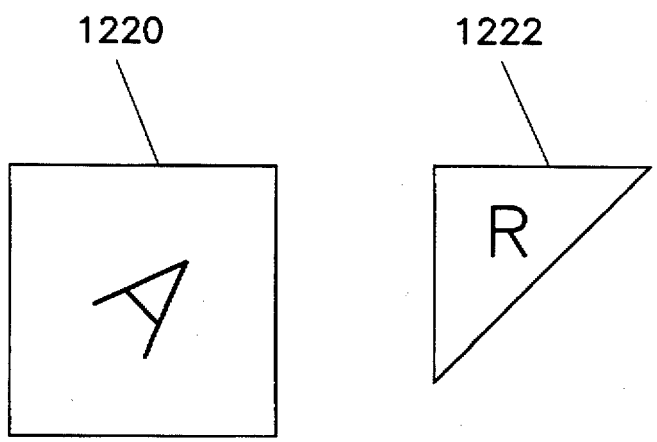
FIG. 12B is a diagrammatic representation of a two masks, according to the present invention, for use in photolithographic apparatus.

FIG. 12B shows two masks 1220 and 1222, neither of which is a composite mask. The one mask 1220 contains the pattern "A" for one group of dies (e.g., 702), and the other mask contains the pattern "R" for another group of nonhomogeneous dies (e.g., 703). In this case, all of the dies of the one group would be exposed using the one mask 1220, and all of the dies of the other group would be exposed using the mask 1222. Of course, it would be necessary to reorient the mask 1222 from die-to-die, such as was explained with respect to FIG. 11B.

The dies 802 and 803 of FIG. 8A, although non-homogeneous, also exhibit the ability to be exposed using a composite mask, or by using two (non-composite) masks.

For computer-controlled, non-lithographic pressure, such as electron beam processing of a wafer, the techniques of FIGS. 11A, 11B, 12A and 12B can be implemented in software, by way of analogy. For example, two dissimilarly oriented versions of a pattern can be coded into the computer (not shown), to process two or more dies at a time (compare FIG. 11A and 12A). Or, all of the dies in one orientation can be processed one-by-one, then the mask-in-software can be rotated to process all of the dies of another orientation, one die at a time. This is feasible for homogeneous or nonhomogeneous dies (compare FIGS. 11B and 12B). In any of these nonlithographic processes, the software code contain a virtual "mask" comparable to the masks and composite masks of FIGS. 11A, 11B, 12A and 12B.

System level products may be designed and fabricated in various forms. A system level product may, for example, include a single chip modules ("SCM") having a single semiconductor die in a single package body, with or without other electrical components, such as capacitors. System level products may also include multi-chip modules ("MCM") having two or more semiconductor dies in the same or separate package bodies, with or without other electrical components. System level products may also include board level products ("BLP"), such as those having one or more semiconductor devices on one or more printed wiring boards. Box level products ("Boxes") are also system level products which may include a combination of SCMs, MCMs, BLPs, and/or other devices.

One or more of such SCMs, MCMs, BLPs or Boxes may act as, or be integrated into, a functional system or sub-system or the like.

System level products can be employed to carry out numerous applications and in various environments. For example, system level products may include:

Pin grid array semiconductor packages, chip carriers (leaded or leadless), flat packs (such as plastic quad gullwing flat packs), ceramic packages and small outline integrated circuits are also examples of SCMs. Numerous other examples, designs and types of SCMs are known to those of ordinary skill in the art of semiconductor integrated circuit packages.

When two or more semiconductor dies are mounted in the same or separate package body, with or without other electrical components, the resulting assembly is typically referred to as a multi-chip module (MCM).

In order to connect to one of the two or more semiconductor dies of a MCM, a substrate having conductive traces (like substrate 404 of FIG. 4) is often used. Additional components such as capacitors, resistors and inductors may be mounted to the substrate. Often, the interconnections between the various components mounted to the substrate necessitate a large number of conductive traces which need to cross one another. In such cases, it is known to provide a substrate, having alternating layers of insulating material (such as fiberglass, teflon, FR4, BT resin, and the like) and conductive trace patterns (typically formed of metal foils, such as copper). The conductive traces from one layer are typically connected to the conductive traces of another layer by plated through-holes or vias.

A BLP typically includes one or more semiconductor devices (such as a single chip module and/or a multi-chip module), in addition to other components, on one or more printed wiring boards.

Boxes are also system level products which may include a combination of SCMs, MCMs, BLPs, and/or other devices. For example, multiple board level products may be connected in parallel with one another by a bus (such as a backplane bus, which is also referred to as a mother board), which communicates signals therebetween. Numerous other examples, designs and types of Boxes are readily apparent to one of ordinary skill in the art. The conductive leads wires exit the boxes, and are usually terminated at external leads or pins.

What is claimed is:

1. An electronic system having at least one semiconductor integrated circuit package containing a non-square semiconductor die, said system comprising:

a non-square semiconductor die having a plurality of bond pads thereon;

a patterned layer of conductive lines having inner and outer ends, the inner ends of the conductive lines defining a non-square die-receiving area for mounting the non-square semiconductor die;

the plurality of bond pads connected to the inner ends of the conductive lines with bond wires an integrated circuit package formed about the non-square semiconductor die, the inner ends of the conductive lines and the non-square die-receiving area, the non-square die-receiving area having a triangular shape defined by angles alpha, beta and phi, wherein one of the angles is substantially equal to 90°; and the outer ends of the conductive lines connected to an electronic system.

2. The system of claim 1, wherein the electronic system is a single chip module.

3. The system of claim 1, wherein the electronic system is a multi-chip module having at least one integrated circuit.

4. The system of claim 1, wherein the electronic system is a board level product having a plurality of integrated circuits on at least one printed wiring board.

5. The system of claim 1, wherein the electronic system is a box level system having a plurality if integrated circuits on at least one printed wiring board mounted into a box with a power source.

6. The system of claim 1, wherein the electronic system is selected from the group comprising personal computers, work stations, servers, minicomputers, mainframe computers and super computers.

7. The system of claim 1, wherein the electronic system is selected from the group comprising security systems, entertainment systems, data storage systems, data acquisition systems, telecommunications systems and satellite systems.

8. The system of claim 1, wherein the electronic system is selected from the group comprising digital video systems, digital audio systems, digital entertainment systems, direct broadcast digital video systems, and digital video cable systems.

9. The system of claim 1, wherein the electronic system is selected from the group comprising televisions, cameras, recorders, compact disc players/recorders, and digital tape players/recorders.

10. The system of claim 1, wherein the electronic system is selected from the group comprising cellular telephones, private branch exchange, telephone switching, video picture telephones, network controllers, encoders and decoders.

11. The system of claim 1, wherein the electronic system is selected from the group comprising control, monitoring and navigational systems for airplanes, trains, automobiles, helicopters, rockets, missiles, boats and submarines.

12. An electronic system, comprising:

a non-square semiconductor die having a plurality of bond pads thereon;

a patterned layer of conductive lines having inner and outer ends, the inner ends of the conductive lines defining a non-square die-receiving area for mounting the non-square semiconductor die;

the plurality of bond pads connected to the inner ends of the conductive lines with bond wires;

a semiconductor integrated circuit package formed about the non-square semiconductor die, the inner ends of the conductive lines and the non-square die-receiving area, the semiconductor integrated circuit body having an external surface with the outer ends of the conductive lines thereon, and the non-square die-receiving area having a non-rectangular parallelogram shape; and the outer ends of the conductive lines on the external surface of the semiconductor integrated circuit package connected to an electronic system.

13. The system of claim 12, further comprising:

external pins arranged on the external surface of the integrated circuit package and connected to the outer ends of the conductive lines, wherein the external pins connect to the electronic system.

14. The system of claim 12, further comprising:

ball bumps arranged on the external surface of the integrated circuit package and connected to the outer ends of the conductive lines, wherein the ball bumps connect to the electronic system.

* * * * *